(12) United States Patent
Hong et al.

(10) Patent No.: US 11,322,206 B2
(45) Date of Patent: May 3, 2022

(54) STORAGE DEVICE AND OPERATING METHOD THEREOF

(71) Applicant: SAMSUNG ELECTRONICS CO., LTD., Suwon-si (KR)

(72) Inventors: Jinwoo Hong, Seoul (KR); Chanha Kim, Hwaseong-si (KR); Kangho Roh, Seoul (KR); Seungkyung Ro, Anyang-si (KR); Yunjung Lee, Suwon-si (KR); Heewon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 17/036,060

(22) Filed: Sep. 29, 2020

(65) Prior Publication Data
US 2021/0166764 A1  Jun. 3, 2021

(30) Foreign Application Priority Data

Nov. 28, 2019 (KR) .................... 10-2019-0156120

(51) Int. Cl.
*G11C 7/00* (2006.01)
*G11C 16/10* (2006.01)
(Continued)

(52) U.S. Cl.
CPC ............ *G11C 16/10* (2013.01); *G06F 3/0604* (2013.01); *G06F 3/0659* (2013.01);
(Continued)

(58) Field of Classification Search
CPC ........ G11C 2211/5644; G11C 16/3495; G11C 16/10; G11C 16/0483; G11C 16/20;
(Continued)

(56) References Cited

U.S. PATENT DOCUMENTS 6,480,438 B1    11/2002  Park
8,891,303 B1 *  11/2014  Higgins .............. G06F 11/1072
                                        365/185.1
(Continued)

FOREIGN PATENT DOCUMENTS

WO       2017218170 A1    12/2017

OTHER PUBLICATIONS

Minghai Qin, "Fractional Bits-per-cell for NAND Flash with Low Read Latency", GLOBECOM 2017—2017 IEEE Global Communications Conference, DOI: 10.1109/GLOCOM.2017.8254419, Dec. 4-8, 2017, 7 pages total.
(Continued)

*Primary Examiner* — Uyen Smet
(74) *Attorney, Agent, or Firm* — Sughrue Mion, PLLC

(57) ABSTRACT

A storage device and an operating method thereof are provided. The storage device includes a non-volatile memory and a memory controller. The non-volatile memory includes memory blocks each including a word lines. The
(Continued)

memory controller determines a word line strength of each of the word lines, adjusts a state count of each of the word lines based on the word line strengths, and adjust a program parameter of each of the word lines to decrease a program time variation between the word lines.

20 Claims, 24 Drawing Sheets

(51) Int. Cl.
*G06N 20/00* (2019.01)
*G06F 3/06* (2006.01)
*G11C 16/04* (2006.01)
*H01L 27/115* (2017.01)

(52) U.S. Cl.
CPC ............ *G06F 3/0679* (2013.01); *G06N 20/00* (2019.01); *G11C 16/0483* (2013.01); *H01L 27/115* (2013.01)

(58) Field of Classification Search
CPC ........ G11C 2211/5621; G11C 11/5628; G11C 2211/5641; G11C 16/08; G11C 16/34; G11C 16/3459; G11C 8/14; G06F 3/0604; G06F 3/0659; G06F 3/0679; G06N 20/00; H01L 27/115

See application file for complete search history.

(56) References Cited

U.S. PATENT DOCUMENTS

| | | | |
|---|---|---|---|
| 9,324,420 B2 | 4/2016 | Shin et al. | |
| 9,875,811 B2 | 1/2018 | Hung et al. | |
| 10,049,749 B2 | 8/2018 | Shibata | |
| 10,236,069 B2 | 3/2019 | Wu et al. | |
| 2014/0359197 A1 | 12/2014 | Franceschini et al. | |
| 2015/0003152 A1 | 1/2015 | Kwak et al. | |
| 2016/0172041 A1* | 6/2016 | Sakui ................. | G11C 16/0483 365/185.03 |
| 2017/0293527 A1 | 10/2017 | Shappir et al. | |
| 2019/0006003 A1 | 1/2019 | Kirshenbaum et al. | |
| 2020/0159619 A1* | 5/2020 | Oh ..................... | G11C 13/0035 |

OTHER PUBLICATIONS

Communication dated Apr. 9, 2021 issued by the European Patent Office in European Application No. 20208778.9.

* cited by examiner

|  | E | P1 | P2 | P3 | P4 | P5 |
|---|---|---|---|---|---|---|
| E | S0 | S1 | S2 | S3 | S4 | S5 |
| P1 | S6 | S7 | S8 | S9 | S10 | S11 |
| P2 | S12 | S13 | S14 | S15 | S16 | S17 |
| P3 | S18 | S19 | S20 | S21 | S22 | S23 |
| P4 | S24 | S25 | S26 | S27 | S28 | S29 |
| P5 | S30 | S31 | | | | |

MC1 (columns), MC2 (rows)

STORAGE DEVICE AND OPERATING METHOD THEREOF

CROSS-REFERENCE TO RELATED APPLICATION

This application claims priority to Korean Patent Application No. 10-2019-0156120, filed on Nov. 28, 2019, in the Korean Intellectual Property Office, the disclosure of which is incorporated by reference herein in its entirety.

BACKGROUND

1. Field

The present disclosure relates to a storage device and, more particularly, to a storage device and an operating method thereof, which adjust the number of states programmed in a non-volatile memory cell by units of word lines.

2. Description of Related Art

In a non-volatile memory, a flash memory may maintain data stored therein even when power is cut off. In a program operation and an erase operation each performed on a word line of flash memory, a high voltage is applied to memory cells connected to the word line, and due to this, the word line may be aged and the strength of the word line may deteriorate over time. When the lifetime of one word line included in a memory block ends, the lifetime of the memory block may end. In other words, if one word line of a block fails, the entire memory block cannot be used.

SUMMARY

It is an aspect to provide a storage device and an operating method thereof, which adjust a state count representing the number of levels enabling a memory cell to be programmed on each of a plurality of word lines, based on the strength of each of the plurality of word lines in order to provide wear leveling for each word line.

According to an aspect of an embodiment, there is provided a storage device comprising a non-volatile memory including a plurality of memory blocks each including a plurality of word lines; and a memory controller configured to determine a word line strength of each of the plurality of word lines, adjust a state count of each of the plurality of word lines based on the word line strengths, and adjust a program parameter of each of the plurality of word lines to decrease a program time variation between the plurality of word lines.

According to another aspect of an embodiment, there is provided an operating method of a storage device including a non-volatile memory, the operating method comprising calculating a word line strength of each of a plurality of word lines of the non-volatile memory; adjusting a state count of each of the plurality of word lines based on the word line strengths; and adjusting a program parameter of each of the plurality of word lines to decrease a program time variation between the plurality of word lines.

According to another aspect of an embodiment, there is provided an operating method of a storage device including a non-volatile memory, the operating method comprising calculating a word line strength of each of a plurality of word lines included in the non-volatile memory; grouping the plurality of word lines into a plurality of word line groups based on the word line strengths; adjusting, by word line group, a state count of word lines of each of the plurality of word line groups based on the word line strengths of the word lines; and adjusting, by word line group, a program parameter of the word lines of each of the plurality of word line groups to decrease a program time variation between the word lines of plurality of word line groups.

BRIEF DESCRIPTION OF THE DRAWINGS

Various embodiments will be more clearly understood from the following detailed description taken in conjunction with the accompanying drawings in which.

DETAILED DESCRIPTION

Hereinafter, various embodiments will be described in detail with reference to the accompanying drawings.

Figure 1:
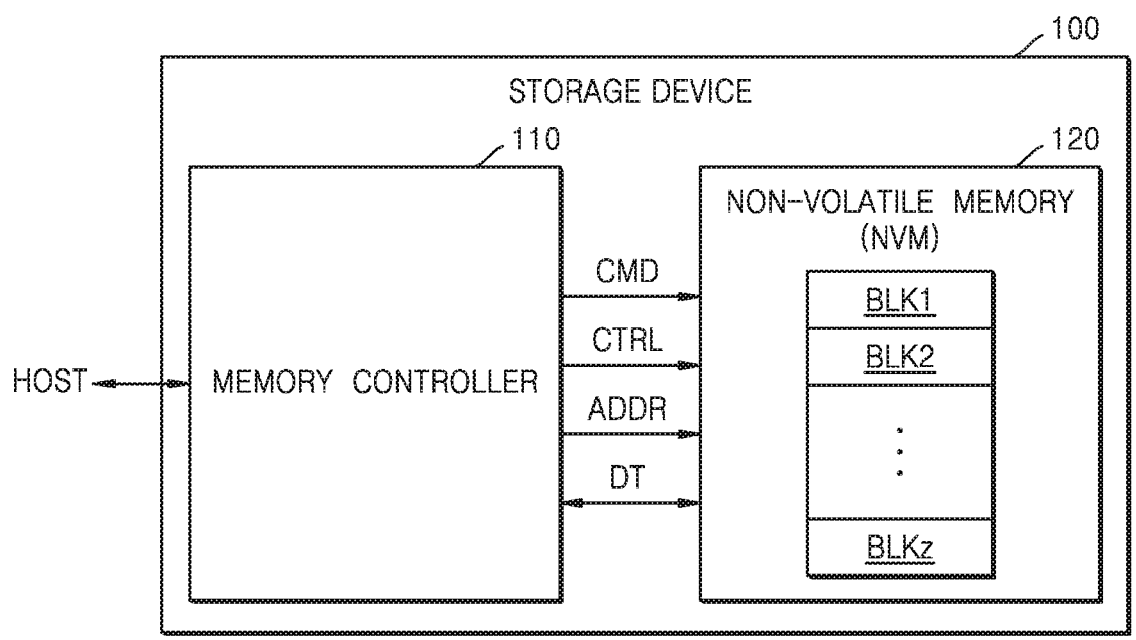
FIG. 1 is a block diagram illustrating a storage device according to an embodiment.

FIG. 1 is a block diagram illustrating a storage device 100 according to an embodiment.

Referring to FIG. 1, the storage device 100 may include a memory controller 110 and a non-volatile memory (NVM) 120, and the storage device 100 may communicate with a host through various interfaces to store data received from the host or to transmit data stored therein to the host.

In some embodiments, the storage device 100 may be an internal memory device embedded into an electronic device. For example, the storage device 100 may be a solid static drive (SSD), an embedded universal flash storage (UFS), or an embedded multi-media card (eMMC). In some embodiments, the storage device 100 may be an external memory attachable/detachable on/from an electronic device. For example, the storage device 100 may be a portable SSD, a UFS, a compact flash (CF) card, a secure digital (SD) card, a micro-secure digital (micro-SD) card, a mini-secure digital (mini-SD) card, an extreme digital (xD) card, or a memory stick.

An electronic device equipped with the storage device 100 or connected to the storage device 100 may be, for example, a personal computer (PC), a data server, a network-attached storage, an Internet of things (IoT) device, or a portable electronic device, etc. Examples of the portable electronic device may include laptops, mobile phones, smartphones, tablet PCs, personal digital assistants (PDAs), enterprise digital assistants (EDAs), digital still cameras, digital video cameras, audio devices, portable multimedia players (PMPs), personal navigation devices (PNDs), MP3 players, handheld game consoles, e-books, or wearable devices, etc.

The non-volatile memory 120 may denote a memory or a memory device having a characteristic where data stored therein is maintained even when power is cut off. Therefore, even when power supplied to the storage device 100 is cut off, data stored in the non-volatile memory 120 may be maintained. The data may be, for example, user data.

The non-volatile memory 120 may operate based on control by the memory controller 110. For example, the non-volatile memory 120 may receive a command CMD, an address ADDR, and a control signal CTRL from the memory controller 110, and in response to the received command CMD, the non-volatile memory 120 may write data DT corresponding to the address ADDR, or may read the data DT corresponding to the address ADDR and may transmit the read data DT to the memory controller 110.

The non-volatile memory 120 may include a plurality of memory blocks BLK1 to BLKz, and each of the plurality of memory blocks BLK1 to BLKz may include a plurality of word lines. Here, z may denote a positive integer of 2 or more, and the number of memory blocks BLXz thus may be changed according to various embodiments. A plurality of memory cells may be connected to each word line, and a plurality of memory cells connected to the same word line may configure a physical page. When a memory cell is a multi-level cell storing data of two or more bits, data corresponding to a plurality of logical pages may be stored in a word line. For example, a memory block may be a unit of erase, and a page may be a unit of program and read. In other words, according to embodiments, erasing may be performed per memory block, and programming and reading may be performed per page. In some embodiments, the non-volatile memory 120 may include a plurality of planes, a plurality of dies, or a plurality of chips.

In some embodiments, the non-volatile memory 120 may include a NAND flash memory device. In some embodiments, the non-volatile memory 120 may be a planar NAND flash memory device having a two-dimensional (2D) horizontal array structure (see, e.g., FIG. 2A), or may be a vertical NAND (VNAND) flash memory device having a three-dimensional (3D) array structure (see, e.g., FIG. 3A). However, these are only examples and embodiments are not limited thereto, and the non-volatile memory 120 may include resistive memory devices such as resistive random access memory (RAM) (ReRAM), phase change RAM (PRAM), and/or magnetic RAM (MRAM). Hereinafter, for convenience of description, the non-volatile memory 120 will be described as a NAND flash memory, but it may be understood that the embodiments are not limited thereto.

The memory controller 110 may control an overall operation of the storage device 100. The memory controller 110 may control a write operation, a read operation, and an erase operation each performed on the non-volatile memory 120 and may set and adjust parameters associated with the write operation, the read operation, and/or the erase operation.

For example, in response to a request of the host, the memory controller 110 may write data, received from the host, in the non-volatile memory 120, or may read the data DT from the non-volatile memory 120 and may transmit the read data DT to the host. The memory controller 110 may encode the data DT and may transmit encoded data to the non-volatile memory 120, and the non-volatile memory 120 may program data, encoded by units of pages, in each word line. The memory controller 110 may decode the data DT read from the non-volatile memory 120.

A memory cell may be programmed to one of a plurality of states (i.e., an erase state and one or more program states) allocated based on a set bit (an integer bit or a non-integer bit (for example, a fractional bit)). For example, when a memory cell stores 2-bit data, the memory cell may be programmed to one of four ($=2^2$) states. When a memory cell stores 2.5-bit data, the memory cell may be programmed to one of six states. Therefore, data may be written in the non-volatile memory 120.

The memory controller 110 may set or adjust a state count of each of a plurality of word lines included in a unit of memory by units of memories of the non-volatile memory 120. In detail, the memory controller 110 may set or adjust the number (i.e., a state count) of states (an erase state and at least one program state) capable of being programmed in a memory cell connected to a corresponding word line of a plurality of word lines. In this case, a unit of memory may be a unit of block, a unit of chip, or a unit of wafer.

The memory controller 110 may calculate a plurality of word line strengths (hereinafter referred to as "a strength") respectively corresponding to a plurality of word lines (i.e., a strength for each word line) and may set or adjust a state count of each of the plurality of word lines on the basis of the calculated plurality of strengths. The memory controller 110 may set or adjust a state count of each of a plurality of word lines so that more states are allocated to a word line having relatively high strength (i.e., a strong word line) than a word line having relatively low strength (i.e., a weak word line).

In a NAND flash memory, when a larger number of program or erase operations are performed on a given word line, stress (for example, a high voltage) may be applied to the word line repeatedly, and due to this, the word line may become aged. The stress applied to each word line may differ over time and thus a plurality of word lines may have strengths (i.e., word line strengths) that may differ. As a word line becomes aged, its word line strength may decrease such that the word line becomes weakened.

The memory controller 110 according to various embodiments may adjust a state count of each of a plurality of word lines on the basis of a plurality of strengths respectively corresponding to the plurality of word lines, thereby performing wear-leveling on the plurality of word lines. As a number of states allocated to a word line increases, stress applied to the word line may increase when the word line is programmed. Thus, a small number of states may be allocated to a weak word line, and a relatively larger number of states may be allocated to a strong word line, such that stress applied to the weak word line may be reduced. Accordingly, a certain word line may be prevented from aging faster than other word lines.

In some embodiments, the memory controller 110 may group a plurality of word lines into a plurality of word line groups on the basis of word line strengths of the individual word lines, and may dynamically adjust a state count and a program parameter for the word lines of each of the plurality of word line groups. In other words, in some embodiments, the word lines included a word line group may be adjusted together, rather than individually.

In some embodiments, the memory controller 110 may adjust a state count of each of a plurality of word lines through reinforcement learning. The memory controller 110 may perform reinforcement learning on the basis of previously profiled information.

In some embodiments, the memory controller 110 may periodically adjust a state count of each of a plurality of word lines during a runtime of the storage device 100. In other embodiments, the memory controller 110 may aperiodically adjust a state count of each of a plurality of word lines during a runtime of the storage device 100. However, embodiments are not limited thereto, and in other embodiments, the memory controller 110 may previously set a state count of each of a plurality of word lines (e.g., a set state count that is stored in advance in memory) and may control a program operation and a read operation of the non-volatile memory 120 on the basis of a set state count during the runtime of the storage device 100.

In some embodiments, the memory controller 110 may adjust a state count of each of a plurality of word lines to dynamically adjust a program parameter of each of the plurality of word lines. For example, a program time of a word line having a high state count may be longer than a program time of a word line having a low state count. In this case, a program time may denote a time taken until a program operation ends after the program operation starts on a word line. The memory controller 110 may dynamically adjust a program parameter of each of a plurality of word lines to decrease a program time variation between the plurality of word lines.

As described above, the storage device 100 according to an embodiment may calculate a strength of each of a plurality of word lines and may adjust a state count of each word line on the basis of the calculated plurality of strengths respectively corresponding to the plurality of word lines. A relatively large number of states may be allocated to a strong word line, and a relatively small number of states may be allocated to a weak word line. Accordingly, a state count of a strong word line may increase, and a state count of a weak word line may decrease. After a state count is adjusted, the storage device 100 may dynamically adjust a program parameter of each of the word lines so as to decrease a program time variation between the word lines. For example, for a word line with a small number of states, the program time may be increased as compared to a program time for a word line with a larger number of states.

When it is no longer possible to perform a write operation and/or a read operation on at least one of a plurality of word lines, in other words, when it is no longer possible to decode data read from a word line, a write operation and a read operation may no longer be performed on a corresponding memory block that includes the word line. The storage device 100 according to an embodiment may adjust a state count of each word line so that a relatively large number of states are allocated to a strong word line and a relatively small number of states are allocated to a weak word line, thereby performing wear-leveling on each word line. Therefore, it is possible to prevent a write operation and/or a read operation from being unable to be performed due to aging of a certain word line, and thus, the lifetime of each memory block may increase. Accordingly, the reliability of the non-volatile memory 120 and the storage device 100 may be enhanced.

Figure 2A:
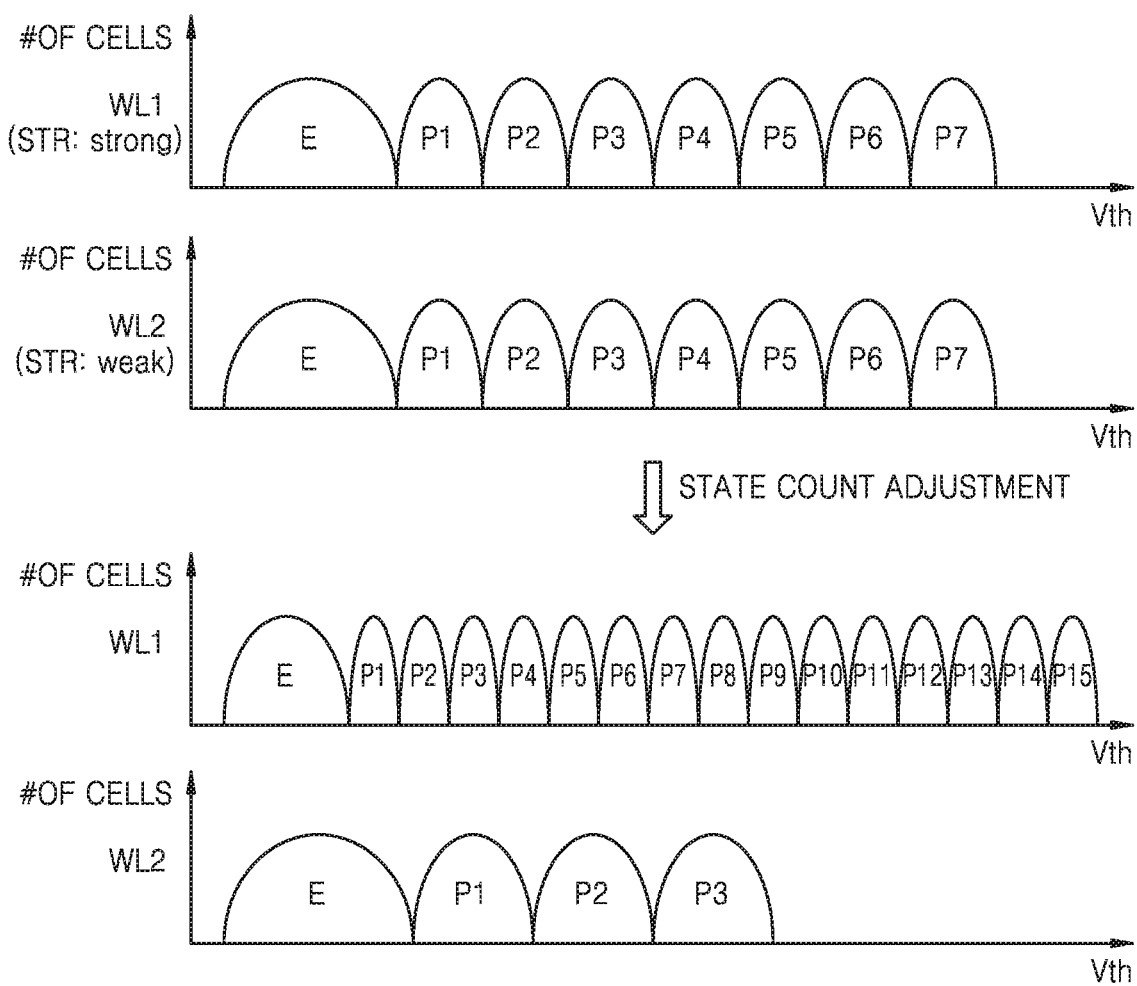
FIGS. 2A and 2B illustrate examples in which a state count of a word line is adjusted in a storage device according to various embodiments.
Figure 2B:
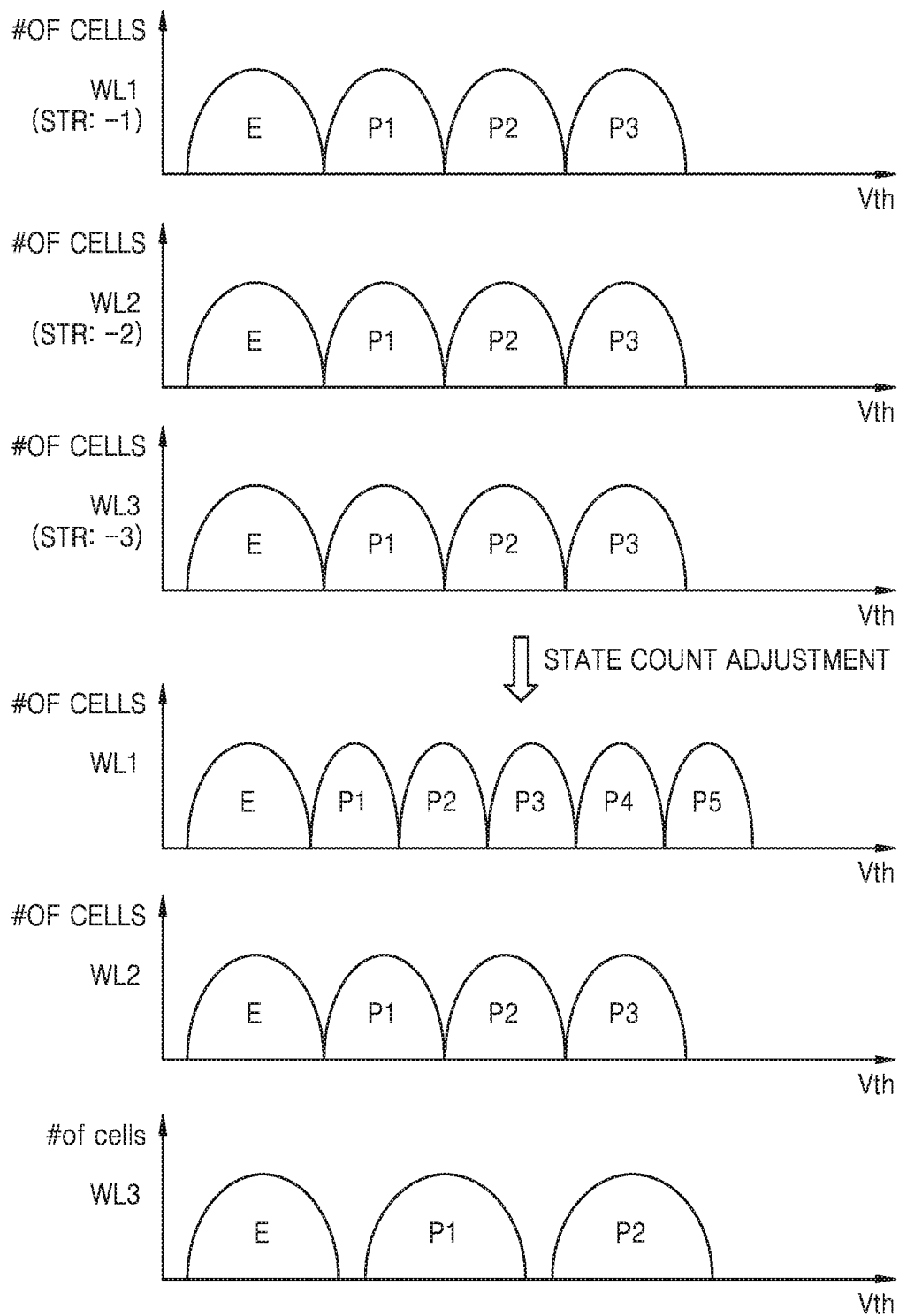

FIGS. 2A and 2B illustrate examples where a state count of a word line is adjusted in a storage device according to various embodiments.

For convenience of description, in FIG. 2A, two word lines (for example, a first word line WL1 and a second word line WL2) will be described as an example, and in FIG. 2B, three word lines (for example, a first word line WL1, a second word line WL2, and a third word line WL3) will be described as an example. However, embodiments are not limited thereto, and adjustment of a state count may be performed by units of memories, and for example, may be performed on a plurality of word lines included in a memory block or a memory chip.

Referring to FIG. 2A, eight states (e.g., an erase state E and first to seventh program states P1 to P7) may be applied to each of a first word line WL1 and a second word line WL2, and in a program process, the first word line WL1 and the second word line WL2 may be programmed to one of the eight states. Therefore, 3-bit data may be stored in each of a memory cell of the first word line WL1 and a memory cell of the second word line WL2.

Since a program operation, a read operation, and an erase operation are performed on each of the first and second word lines WL1 and WL2, the first word line WL1 and the second word line WL2 may become aged over time. For example, a strength of the first word line WL1 may relatively increase, and a strength of the second word line WL2 may relatively decrease in a case in which the second word line WL2 is used more often over time. For example, when the number of programs and/or the number of reads on the first word line WL1 are/is smaller than the number of programs and/or the number of reads on the second word line WL2, a strength of the first word line WL1 may be greater than that of the second word line WL2.

A state count of each of the first word line WL1 and the second word line WL2 may be adjusted so that a large number of states are allocated to a strong word line and a small number of states are allocated to a weak word line. A state count of the first word line WL1 may increase, and a state count of the second word line WL2 may decrease. For example, a state count of the first word line WL1 may increase from eight to twelve, and a state count of the second word line WL2 may decrease from eight to four. As illustrated, twelve states (for example, an erase state E and first to fifteenth program states P1 to P15) may be allocated to the first word line WL1, and four states (for example, an erase state E and first to third program states P1 to P3) may be allocated to the second word line WL2. Therefore, 4-bit data may be stored in a memory cell of the first word line WL1, and 2-bit data may be stored in a memory cell of the second word line WL2.

Referring to FIG. 2B, four states (i.e., an erase state E and first to third program states P1 to P3) may be allocated to each of a first word line WL1, a second word line WL2, and a third word line WL3, and in a program process, the first word line WL1, the second word line WL2, and the third word line WL3 may be programmed to one of eight states. Therefore, 2-bit data may be stored in each of a memory cell of the first word line WL1, a memory cell of the second word line WL2, and a memory cell of the second word line WL3.

Since a program operation, a read operation, and an erase operation are performed on each of word lines, the first word line WL1, the second word line WL2, and the third word line WL3 may become aged over time. A strength of the first word line WL1, a strength of the second word line WL2, and a strength of the third word line WL3 may respectively be −1, −2, and −3. That is, the first word line WL1 may be strongest, and the third word line WL3 may be weakest.

A state count of each of the first word line WL1, the second word line WL2, and the third word line WL3 may be adjusted so that a large number of states are allocated to a strong word line and a small number of states are allocated to a weak word line. For example, a state count of the first word line WL1 may increase from four to six, a state count of the second word line WL2 may be maintained as four, and a state count of the third word line WL3 may decrease from four to two. Therefore, 2.5-bit data may be stored in a memory cell of the first word line WL1, 2-bit data may be stored in a memory cell of the second word line WL2, and 1.5-bit data may be stored in a memory cell of the third word line WL3.

As described above with reference to FIGS. 2A and 2B, a state count adjustment may be performed to adjust a state count of each of a plurality of word lines on the basis of a strength of each of the plurality of word lines. In an embodiment, as illustrated in FIG. 2B, a state count of a word line may have a value other than $2^s$ (where s is a natural number) representing an integer bit, and for example fractional-bit data may be stored in a memory cell of a word line.

Figure 3A:
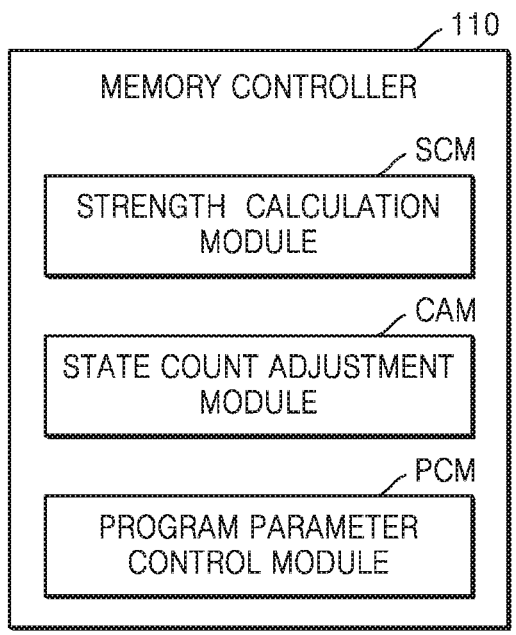
FIG. 3A is a block diagram illustrating a memory controller according to an embodiment.
Figure 3B:
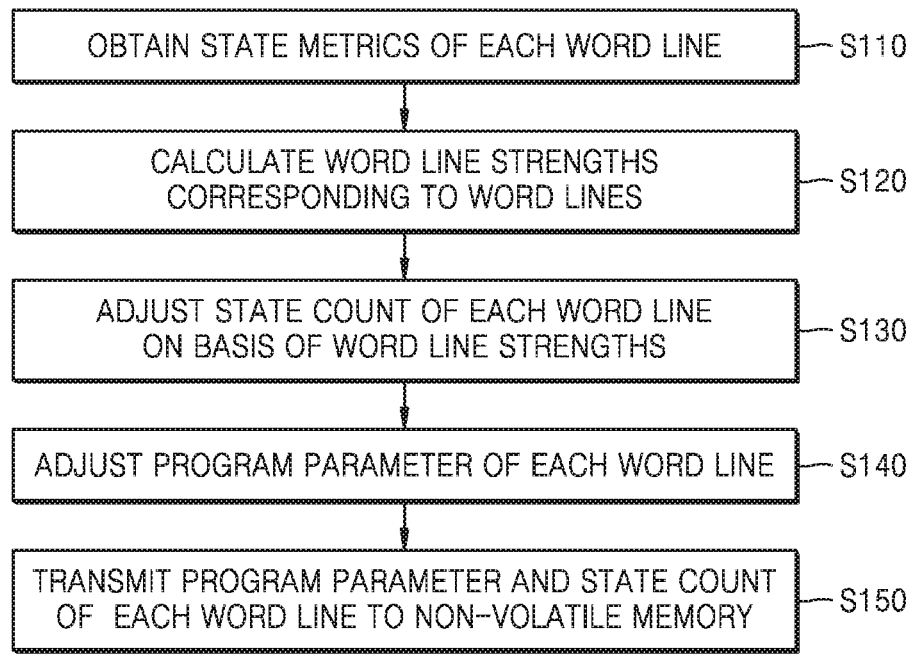
FIG. 3B is a flowchart illustrating an operating method of the memory controller of FIG. 3A, according to an embodiment.

FIG. 3A is a block diagram illustrating a memory controller according to an embodiment, and FIG. 3B is a flowchart illustrating an operating method of the memory controller of FIG. 3A, according to an embodiment. The operating method of FIG. 3B may be performed at a runtime (for example, a process of performing a write operation, a read operation, and an erase operation on the non-volatile memory 120 on the basis of a request of the host) of a storage device (100 of FIG. 1), or may be performed before the runtime (for example, in a manufacturing process or a booting process of the storage device).

Referring to FIG. 3A, the memory controller 110 may include a strength calculation module SCM, a state count adjustment module CAM, and a program parameter control module PCM.

Elements according to embodiments may be referred to by using the term "module" in various embodiments. A "module" may be implemented as various hardware devices such as an integrated circuit (IC), an application specific IC (ASIC), a field programmable gate array (FPGA), and a complex programmable logic device (CPLD), firmware or software driven in hardware devices, or a combination of a hardware device or software. Also, a "module" may include intellectual property (IP) or circuits configured with semiconductor devices.

The strength calculation module SCM may calculate the strength of each of a plurality of word lines. The strength calculation module SCM may calculate the strength of each word line on the basis of a program parameter and state metrics (for example, state metrics associated with a program operation, a read operation, and an erase operation).

The state count adjustment module CAM may adjust a state count of each of the plurality of word lines on the basis of the calculated strength of each of the plurality of word lines.

The program parameter control module PCM may adjust a program parameter of each of the plurality of word lines. For example, the program parameter may include at least one of a program start voltage, a program voltage difference, and a program verify voltage. The program parameter control module PCM may adjust the program parameter to decrease a difference (hereinafter referred to as a program time variation) between times for which a program operation is performed on the plurality of word lines.

Referring to FIG. 3B, in operation S110, the memory controller 110 may obtain state metrics of the plurality of word lines. For example, the strength calculation module SCM may obtain the state metrics on the basis of signals received from the non-volatile memory 120, and the state metrics may include, for example, a real program time, an erase time, a read time, a read error bit, a read level shift value, and a state count. For example, when a program operation is performed on each word line of the non-volatile memory 120, the memory controller 110 may obtain and store a real program time. In some embodiments, the memory controller 110 may obtain and store the state metrics every time a program operation is performed, and in other embodiments, the memory controller 110 may obtain and store the state metrics periodically.

The strength calculation module SCM may calculate a plurality of word line strengths corresponding to the plurality of word lines in operation S120. In other words, the strength calculation module SCM may calculate the strength of each of the plurality of word lines. The strength calculation module SCM may calculate the strength of each word line on the basis of a program parameter and the state metrics which are collected in operation S110.

In an embodiment, the strength calculation module SCM may calculate the strength on the basis of an expected program time and a real program time for each word line. For example, the strength calculation module SCM may calculate an expected program time of each word line on the basis of a pre-set program parameter and a pre-set state count and may calculate the strength on the basis of a difference between the expected program time and the real program time. In an embodiment, the strength calculation module SCM may include a strength calculation function using a program parameter and at least one state metric as variables. However, embodiments are not limited thereto, and for example, the strength calculation module SCM may calculate the strength further on the basis of at least one of other state metrics (for example, an erase time, a read error bit, and a read level shift value) in calculating the strength.

In operation S130, the state count adjustment module CAM may adjust a state count of each of the plurality of word lines on the basis of the plurality of word line strengths. The state count adjustment module CAM may adjust the state count of each of the plurality of word lines so that a large number of states are allocated to a strong word line and a small number of states are allocated to a weak word line. Therefore, wear-leveling may be performed on each word line, and a strength difference between word lines may be reduced.

Operations S120 and S130 may be performed based on reinforcement learning. For example, the strength calculation module SCM and the state count adjustment module CAM may each be implemented as an agent for reinforcement learning, and the agent may calculate a state count of each word line on the basis of a program time, a state count, a program parameter, and state metrics, which are stored by units of word lines. A process of calculating a state count of each word line on the basis of reinforcement learning will be described below in detail with reference to FIGS. 15A to 15B.

The program parameter control module PCM may adjust a program parameter of each of the plurality of word lines on the basis of the adjustment of the state count in operation S140. The program parameter control module PCM may adjust the program parameter of each of the plurality of word lines to decrease a difference (hereinafter referred to as a program time variation) between times for which a program operation is performed on the plurality of word lines.

For example, in the example of FIG. 2A, assuming the state count of the first word line WL1 is adjusted to twelve and the state count of the second word line WL2 is adjusted to four, in a case where a program operation is performed on the first word line WL1 and the second word line WL2 on the basis of the same parameter, a time (i.e., a program time of the first word line WL1) for which a program operation is performed on the first word line WL1 may become longer than a program time of the second word line WL2. In other words, if the fifteen program states P1-P15 of the first word line WL1 shown in the bottom of FIG. 2A each had a same program time as a program time of the seven program states P1-P7 of the first word line WL1 shown in the top of FIG. 2A and similarly if the three program states P1-P3 of the second word line WL2 shown in the bottom of FIG. 2A each had a same program time as a program time of the seven program states P1-P7 of the second word line WL2 shown in the top of FIG. 2A, the total program time of the adjusted first word line WL1 would become significantly longer than that of the adjusted second word line WL2. Therefore, the program parameter control module PCM may adjust program parameter(s) of the first word line WL1 and/or the second word line WL2 so that a real program time of the first word line WL1 becomes more similar to a real program time of the second word line WL2. In other words, as shown in the bottom of FIG. 2A, the program time of each the states of the first word line WL1 may be decreased, and the program time of each of the states of the second word line WL2 may be increased, so that the total program time becomes more similar for the first and second word lines WL1 and WL2 (i.e., so the program time variation decreases).

For example, the program parameter control module PCM may increase a program start voltage of the first word line WL1 or may decrease a program start voltage of the second word line WL2, thereby reducing a program time variation between the first word line WL1 and the second word line WL2. The program parameter control module PCM may adjust at least one of a program start voltage, a program voltage difference, and a program verify voltage of each of the plurality of word lines.

The memory controller 110 may transmit the state count and program parameter of each of the plurality of word lines to the non-volatile memory 120 in operation S150. In an embodiment, the memory controller 110 may transmit, to the non-volatile memory 120, an address representing a word line on which a program operation is to be performed and a state count and program parameter(s) of a corresponding word line, and the non-volatile memory 120 may perform the program operation on the word line represented by the address on the basis of the received state count and program parameter(s). In another embodiment, the memory controller 110 may transmit a state count and a program parameter(s) of each of the plurality of word lines to the non-volatile memory 120, and the non-volatile memory 120 may store the received state count and program parameter(s) of each of the plurality of word lines. Subsequently, the memory controller 110 may transmit an address, on which a program operation is to be performed, to the non-volatile memory 120, and the non-volatile memory 120 may perform the program operation on a word line corresponding to the received address on the basis of the state count and program parameter(s) of the word line.

Figure 4A:
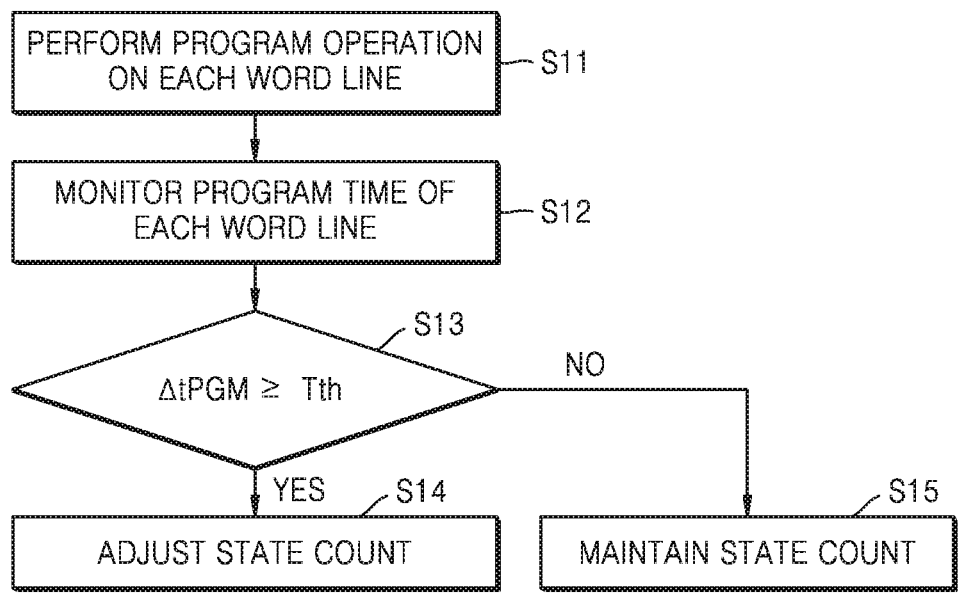
FIGS. 4A to 4C are flowcharts illustrating methods of determining whether to adjust a state count in a memory controller, according to various embodiments.
Figure 4B:
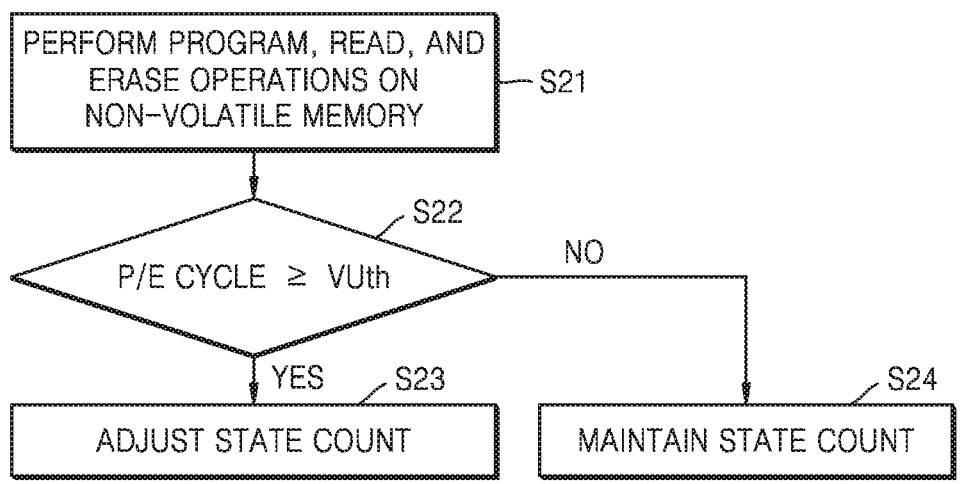
Figure 4C:
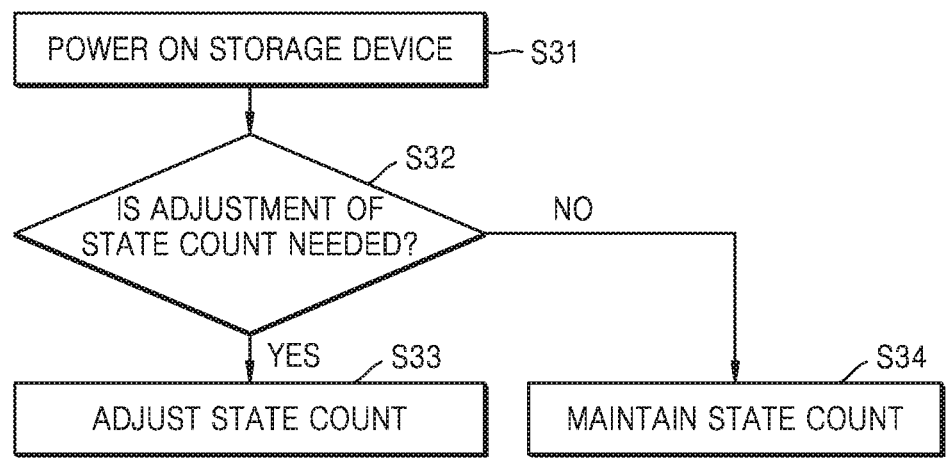

FIGS. 4A to 4C are flowcharts illustrating a method of determining whether to adjust a state count in a memory controller, according to various embodiments.

Referring to FIG. 4A, the memory controller 110 may determine whether to adjust a state count on the basis of a program time variation ΔtPGM between a plurality of word lines.

A program operation may be performed on each of the plurality of word lines in operation S11, and the memory controller 110 may monitor a program time of each of the plurality of word lines in operation S112. The memory controller 110 may transmit a program command CMD corresponding to a word line, and may obtain the program time of the word line on the basis of a response signal (for example, a ready signal and a busy signal) received from the non-volatile memory 120. For example, the memory controller 110 may obtain the program time on the basis of a time taken until the ready signal is received after the busy signal is received.

The memory controller 110 may determine whether the program time variation ΔtPGM between the plurality of word lines is equal to or greater than a threshold time Tth in operation S13. For example, the memory controller 110 may determine whether a maximum value of the program time variation ΔtPGM between the plurality of word lines is equal to or greater than the threshold time Tth. Alternatively, the memory controller 110 may adjust a state count by units of at least two word lines and may determine whether the program time variation ΔtPGM between the at least two word lines is equal to or greater than the threshold time Tth.

When the program time variation ΔtPGM between the plurality of word lines is equal to or greater than the threshold time Tth, the memory controller 110 may adjust a state count of each of the plurality of word lines in operation S14. The memory controller 110 may adjust a state count on the basis of the method described above with reference to FIG. 3B.

On the other hand, when the program time variation ΔtPGM between the plurality of word lines is less than the threshold time Tth, the memory controller 110 may maintain a state count of each of the plurality of word lines in operation S15. A predetermined state count may be maintained for each of the plurality of word lines.

Referring to FIG. 4B, the memory controller 110 may adjust whether to adjust a state count on the basis of a program and erase (P/E) cycle of the plurality of word lines.

A program operation, a read operation, and an erase operation may be performed on each of the plurality of word lines in operation S21, and the memory controller 110 may store the P/E cycle by units of word lines and may update the P/E cycle whenever the program operation and the read operation are performed.

The memory controller 110 may determine whether the P/E cycle is equal to or greater than a threshold value VUth in operation S22. For example, the memory controller 110 may determine whether a P/E cycle of one or more word lines among the plurality of word lines is equal to or greater than the threshold value VUth. As another example, the memory controller 110 may determine whether an average (i.e., an average P/E cycle) of a P/E cycle of each of the plurality of word lines is equal to or greater than the threshold value VUth.

When the P/E cycle is equal to or greater than the threshold value VUth, the memory controller 110 may adjust a state count of each of the plurality of word lines in operation S23. When the P/E cycle is less than the threshold value VUth, the memory controller 110 may adjust a state count of each of the plurality of word lines in operation S24.

Referring to FIG. 4C, when a storage device (100 of FIG. 1) is powered on, the memory controller 110 may determine whether to adjust a state count.

The storage device 100 may be powered on in operation S31. The storage device 100 may receive power from the outside the storage device 100 and may be powered on based on the received power. The memory controller 110 may determine whether to adjust a state count in operation S32. For example, the memory controller 110 may determine whether a condition for performing adjustment of a state count is satisfied in a booting process. For example, as described above with reference to FIGS. 4A and 4B, the memory controller 110 may determine whether the condition for performing the adjustment of the state count is satisfied, based on a program time variation $\Delta tPGM$ between the plurality of word lines and/or a P/E cycle of the plurality of word lines. However, embodiments are not limited thereto, and the condition for performing the adjustment of the state count may be satisfied through various methods.

When it is determined that the adjustment of the state count is needed, namely, when the condition for performing the adjustment of the state count is satisfied, a state count of each of the plurality of word lines may be adjusted in operation S33, and when it is determined that the adjustment of the state count is not needed, a predetermined state count may be maintained for each of the plurality of word lines in operation S34.

The memory controller 110 may periodically or aperiodically adjust a state count of each of a plurality of word lines, and for example, whether to adjust the state count may be determined based on the method described above with reference to FIGS. 4A to 4C.

Figure 5:
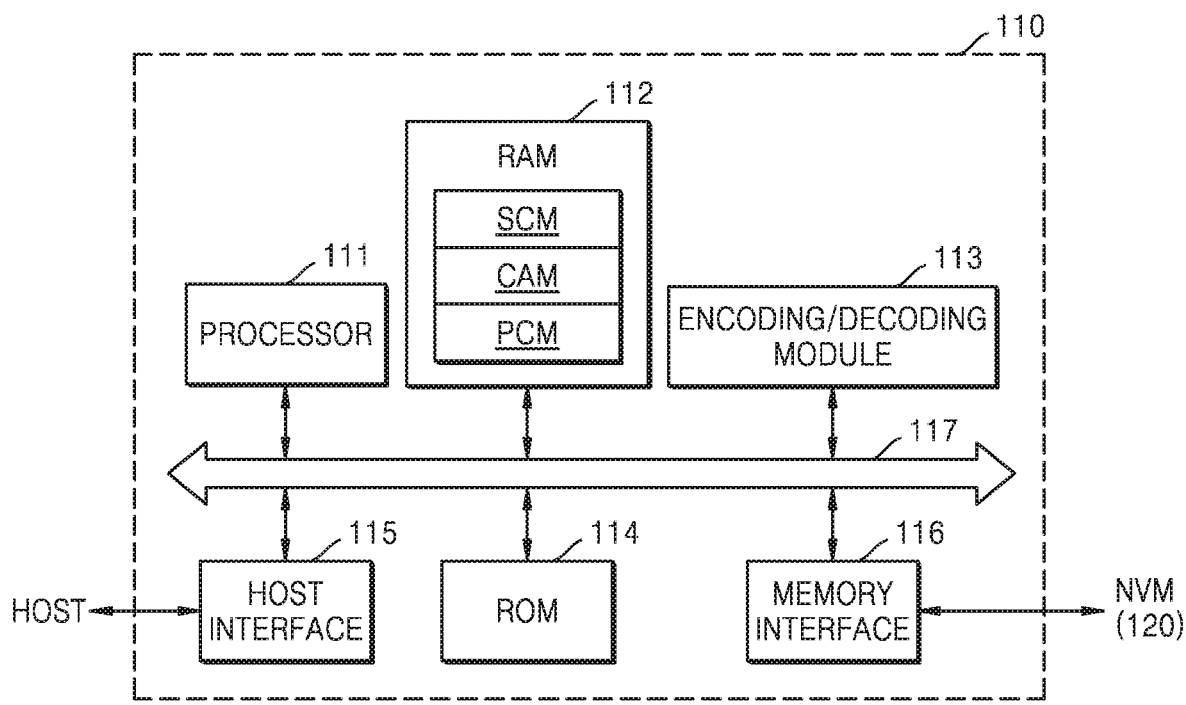
FIG. 5 is a system diagram of a memory controller according to an embodiment.

FIG. 5 is a system diagram of a memory controller 110 according to an embodiment.

Referring to FIG. 5, the memory controller 110 may include a processor 111, random access memory (RAM) 112, an encoding and decoding module 113, read-only memory (ROM) 114, a host interface 115, and a memory interface 116. The elements (for example, the processor 111, the RAM 112, the encoding and decoding module 113, the ROM 114, the host interface 115, and the memory interface 116) of the memory controller 110 may transmit and receive data through a system bus 117. Furthermore, in various embodiments, the memory controller 110 may further include other elements.

The processor 111 may include a central processing unit (CPU) or a microprocessor and may control an overall operation of the memory controller 110. The processor 111 may include program code configured to perform a certain operation or one or more processor cores for executing an instruction set of the program code. The processor 111 may execute instructions code of firmware stored in the ROM 114. In an embodiment, the processor 111 may be implemented as a multi-core processor, and for example, may be implemented as a dual core processor or a quad core processor.

The RAM 112 may operate as at least one of a buffer memory, a cache memory, a working memory, and a main memory of the memory controller 110. The RAM 112 may be implemented as dynamic RAM (DRAM), static RAM (SRAM), or the like, and firmware may be loaded into the RAM 112. The firmware may include program code implemented with an operation algorithm of the memory controller 110 described above with reference to FIGS. 1 to 4C. For example, the firmware may include a strength calculation module SCM, a state count adjustment module CAM, and a program parameter control module PCM.

The encoding and decoding module 113 may perform encoding and decoding on data and may perform error correction on the data. The encoding and decoding module 113 may perform encoding on data which is to be stored in a non-volatile memory 120 and may generate error correction code. The encoding and decoding module 113 may decode data read from the non-volatile memory 120, detect an error of the data on the basis of the error correction code, and correct the detected error. In an embodiment, the encoding and decoding module 113 may be implemented with hardware. In an embodiment, the encoding and decoding module 113 may be implemented with software or hardware and may be loaded into the RAM 112. When it is unable to decode data read from the non-volatile memory 120, namely, when it is unable to correct an error of data by using the error correction code, it may be determined that the lifetime of a corresponding word line from which the data is read and the lifetime of a memory block including the corresponding word line end.

The ROM 114 may store various pieces of information needed for operating the memory controller 110. For example, the ROM 114 may store various pieces of information in a firmware form. When a storage device (100 of FIG. 1) is powered on, firmware stored in the ROM 114 may be loaded into the RAM 112.

The memory controller 110 may communicate with an external device (for example, a host) through the host interface 115. For example, the host interface 115 may include various interfaces such as universal serial bus (USB), multimedia card (MMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), mobile industry processor interface (MIPI), and nonvolatile memory-express (NVM-e).

The memory interface 116 may provide an interface between the memory controller 110 and the non-volatile memory 120. For example, a command, an address, a control signal (for example, a state count and a program parameter), program data, read data, and a response signal may be transmitted and received between the memory controller 110 and the non-volatile memory 120 through the memory interface 116.

Figure 6:
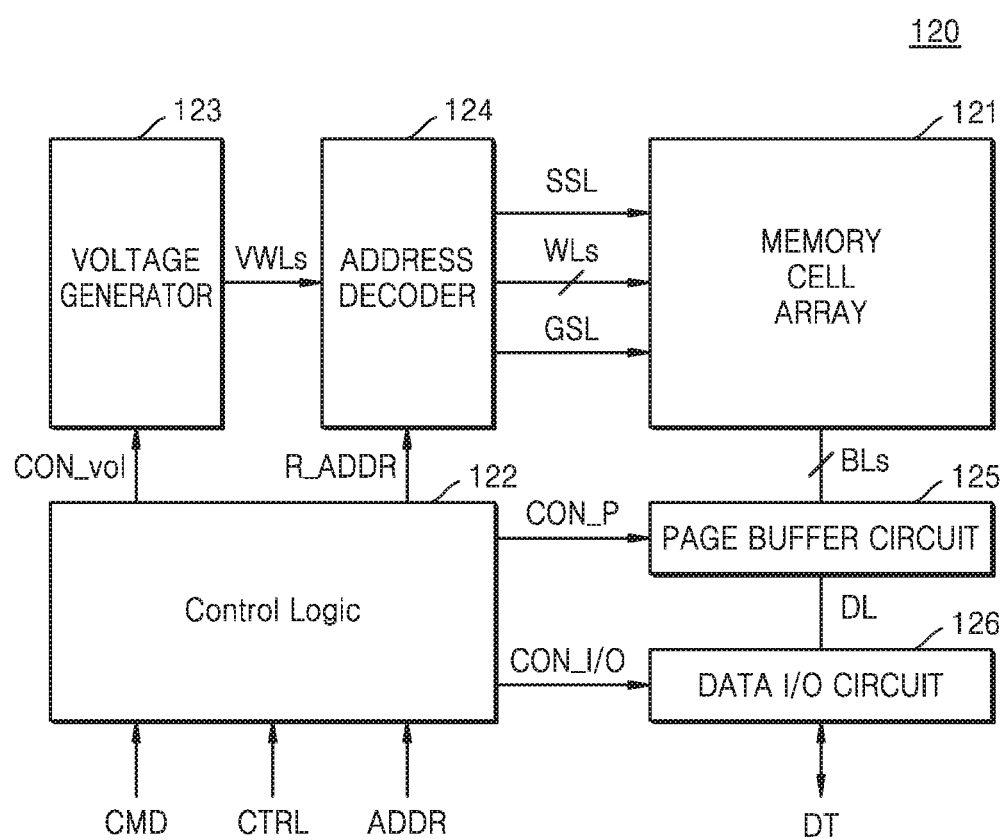
FIG. 6 is a block diagram illustrating a non-volatile memory according to an embodiment.

FIG. 6 is a block diagram illustrating a non-volatile memory 120 according to an embodiment.

Referring to FIG. 6, the non-volatile memory 120 may include a memory cell array 121, a control logic 122, a voltage generator 123, an address decoder 124, a page buffer circuit 125, and a data input/output (I/O) circuit 126.

The memory cell array 121 may be connected to a plurality of word lines WLs and a plurality of bit lines BLs. A memory block may be connected to one or more string selection lines SSL and one or more ground selection lines GSL. The memory cell array 121 may include a plurality of memory blocks, and each of the plurality of memory blocks may include a plurality of memory cells (MC1 to MC8 of FIG. 8A) disposed in a plurality of regions where a plurality of word lines WLs intersect with a plurality of bit lines BLs.

In an embodiment, each of the plurality of memory cells may store 1-bit data or multi-bit data. In an embodiment, each of the plurality of memory cells may store fractional-bit data.

When an erase voltage is applied to the memory cell array 121, the plurality of memory cells may be in an erase state, and a program voltage may be applied to a selected word line of the memory cell array 121, whereby a plurality of memory cells connected to the selected word line may be programmed to a set state. As illustrated in FIGS. 2A and 2B, each of the plurality of memory cells may have an erase state E and at least one program state, which are divided based on a threshold voltage.

Based on a command CMD, an address ADDR, and a control signal CTRL each received from the memory controller 120, the control logic 122 may program data in the memory cell array 121, or may output various control signals for reading data from the memory cell array 121 or erasing the memory cell array 121.

The various control signals output from the control logic 122 may be provided to the voltage generator 123, the address decoder 124, the page buffer circuit 125, and the data I/O circuit 126. In detail, the control logic 122 may provide a voltage control signal CON_vol to the voltage generator 123, provide a row address R ADDR to the address decoder 123, provide a program control signal CON_P to the page buffer circuit 125, and provide a data I/O control signal CON_I/O to the data I/O circuit 126. However, the present disclosure is not limited thereto, and the control logic 122 may further provide different control signals to the voltage generator 123, the address decoder 124, the page buffer circuit 125, and the data I/O circuit 126.

The voltage generator 123 may generate various kinds of voltages for performing a program operation, a read operation, and an erase operation on the memory cell array 121 on the basis of the voltage control signal CON_vol. In detail, the voltage generator 123 may generate a plurality of word line driving voltages VWLs for driving a plurality of word lines WLs. The word line driving voltages VWLs may include, for example, a program voltage (or a write voltage), a read voltage, an erase voltage, an inhibit voltage, or a program verify voltage. The voltage generator 123 may further generate a string selection line driving voltage for driving a plurality of string selection lines SSL and a ground selection line driving voltage for driving a plurality of ground selection lines GSL.

The address decoder 114 may be connected to the memory cell array 121 through the plurality of word lines WLs and may select some word lines from among the plurality of word lines WLs in response to the row address R ADDR received from the control logic 121. In the program operation, the row decoder 124 may apply the program voltage to a selected word line and may apply the inhibit voltage to an unselected word line.

The page buffer circuit 125 may be connected to the memory cell array 121 through the plurality of bit lines BLs. In detail, in the program operation, the page buffer circuit 125 may operate as a write driver to program a state corresponding to data DT which is to be stored in the memory cell array 121. In the read operation, the page buffer 125 may operate as a sense amplifier to output the data DT stored in the memory cell array 121.

The data I/O circuit 126 may transmit data DT, input from the outside, to the page buffer circuit 125, or may transmit the data DT, output from the page buffer circuit 125, to a memory controller (110 of FIG. 1) through a plurality of I/O pins or a data bus.

The control logic 122 according to an embodiment may generate the voltage control signal CON_vol and the program control signal CON_P on the basis of a state count and a program parameter of each of the plurality of word lines WLs received from the memory controller (110 of FIG. 1). The program parameter may include at least one of a program start voltage, a program voltage difference, and a program verify voltage, and the control logic 122 may generate the voltage control signal CON_vol on the basis of the program parameter.

Also, in a case where a program operation is performed on a word line, the control logic 122 may generate the program control signal CON_P so that each of a plurality of memory cells included in the word line is programmed to one of states allocated to the word line, based on a state count received from the memory controller 110 and may provide the program control signal CON_P to the page buffer circuit 125.

Figure 7A:
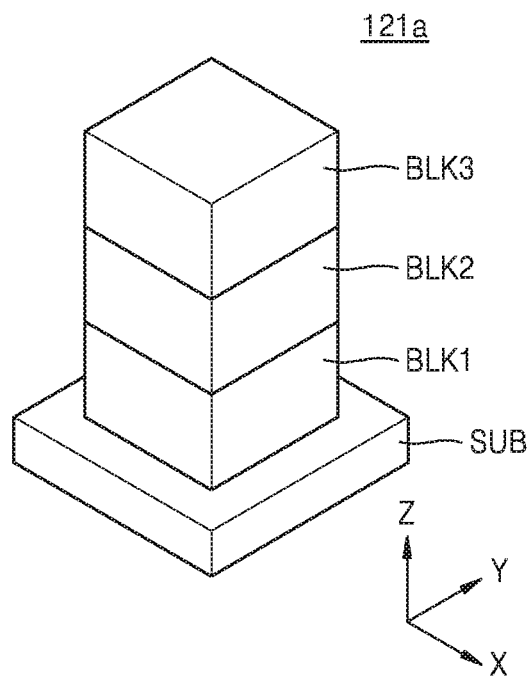
FIGS. 7A and 7B are diagrams illustrating implementation examples of a memory cell array of the non-volatile member of FIG. 6, according to various embodiments.
Figure 7B:
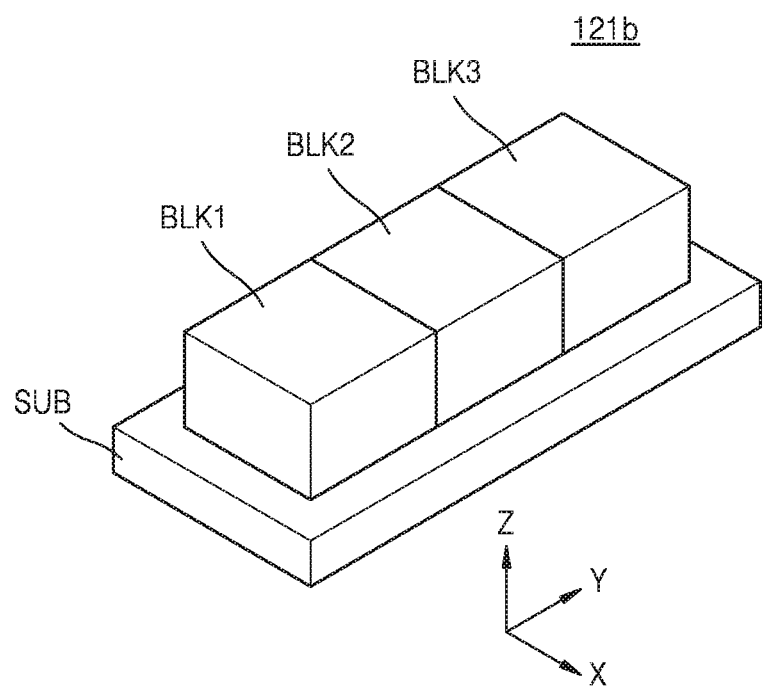

FIGS. 7A and 7B are diagrams illustrating implementation examples of the memory cell array of FIG. 6, according to various embodiments.

Referring to FIGS. 7A and 7B, memory cell arrays 121a and 121b may include a plurality of memory blocks (for example, first to third memory blocks BLK1 to BLK3), and each of the first to third memory blocks BLK1 to BLK3 may have a three-dimensional (3D) structure (or referred to as a vertical structure).

Each of the first to third memory blocks BLK1 to BLK3 may include a plurality of structures which extend in a plurality of directions X, Y, and Z corresponding to the 3D structure. Each of the first to third memory blocks BLK1 to BLK3 may include a plurality of NAND cell strings which extend in a direction (a Z direction) vertical to a substrate SUB.

As illustrated in FIG. 7A, the first to third memory blocks BLK1 to BLK3 may be stacked in a direction vertical to the substrate SUB, or as illustrated in FIG. 7B, the first to third memory blocks BLK1 to BLK3 may be disposed in parallel in a direction (for example, an X direction or a Y direction) parallel to the substrate SUB.

Figure 8A:
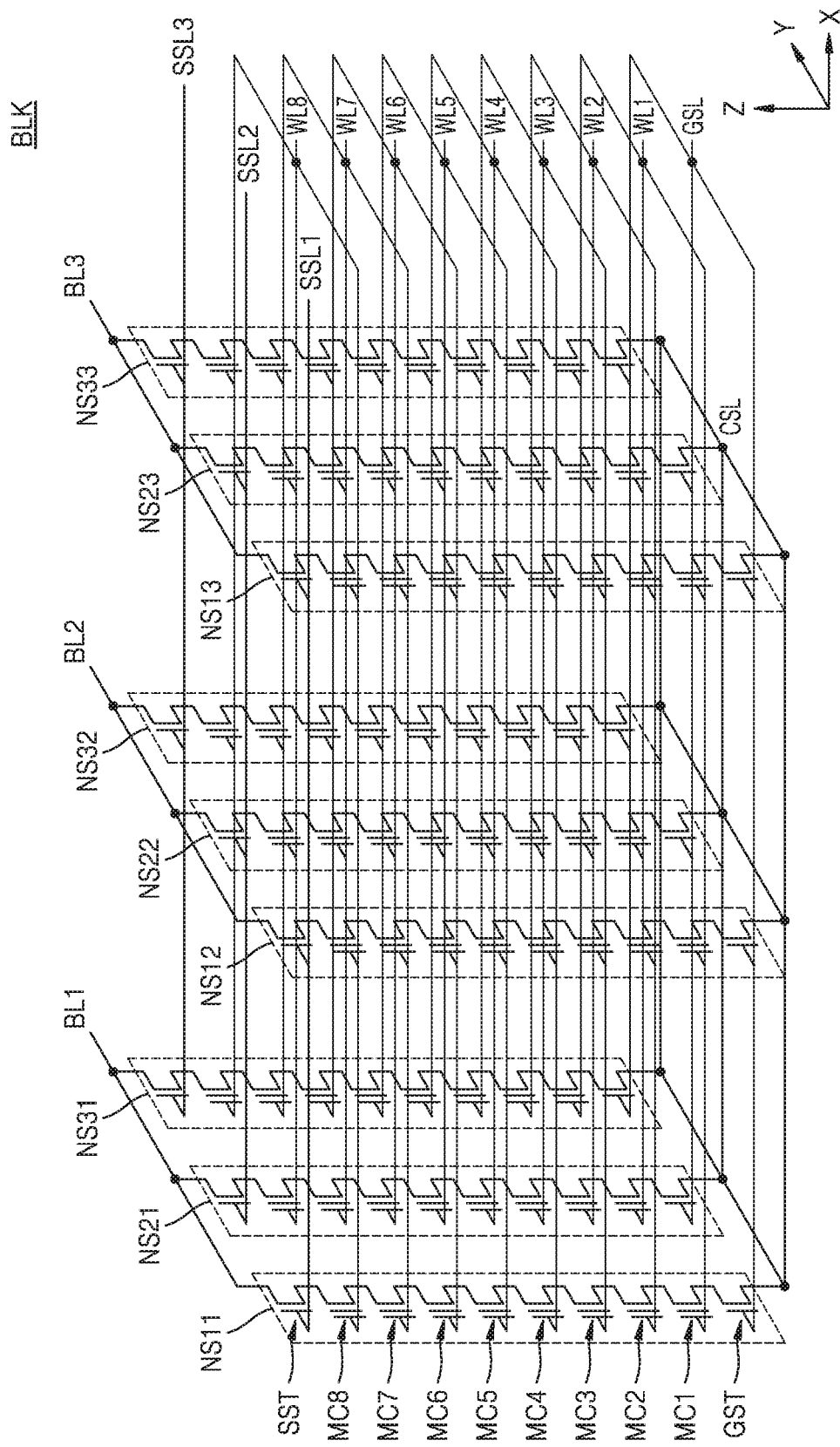
FIG. 8A is a circuit diagram representing an example of a memory block included in a memory controller according to an embodiment.

FIG. 8A is a circuit diagram representing an example of a memory block included in a memory controller according to an embodiment.

Referring to FIG. 8A, a memory block BLK may be a NAND flash memory having a vertical structure, and at least one of a plurality of memory blocks illustrated in FIGS. 7A and 7B may be implemented as the memory block BLK illustrated in FIG. 8A.

The memory block BLK may include a plurality of NAND strings NS11 to NS33, a plurality of word lines WL1 to WL8, a plurality of bit lines BL1 to BL3, a ground selection line GSL, a plurality of string selection lines SSL1 to SSL3, and a common source line CSL. Here, the number of NAND strings, the number of word lines, the number of bit lines, the number of ground selection lines, and the number of string selection lines may be variously changed according to embodiments.

The plurality of NAND strings NS11 to NS33 may be connected between the plurality of bit lines BL1 to BL3 and the common source line CSL. Each NAND string (for example, NS11) may include a string selection transistor SST, a plurality of memory cells (for example, first to eighth memory cells) MC1 to MC8, and a ground selection transistor GST, which are connected in series. In an embodiment, at least one dummy cell may be disposed between the string selection transistor SST and the first memory cell MC1 and/or between the string selection transistor SST and the eighth memory cell MC8.

The string selection transistor SST may be connected to the string selection lines SSL1 to SSL3. The plurality of memory cells MC1 to MC8 may be respectively connected to the word lines WL1 to WL8 corresponding thereto. The ground selection transistor GST may be connected to the ground selection line GSL. The string selection transistor SST may be connected to a corresponding bit line BL, and the ground selection transistor GST may be connected to the common source line CSL.

In the plurality of NAND strings NS11 to NS33, a plurality of first word lines WL1 connected to word lines (for example, a plurality of NAND strings NS11 to NS33) of the same height may be connected in common, and the string selection lines (for example, first to third string selection lines) SSL1 to SSL3 may be separated from one another. The first string selection line SSL1 may be selected, and when a program voltage is applied to the first word line WL1, memory cells included in NAND strings NS11 to NS13 of a first row and connected to the first word line WL1 may be programmed. Accordingly, a program operation may be performed by unit of pages.

Figure 8B:
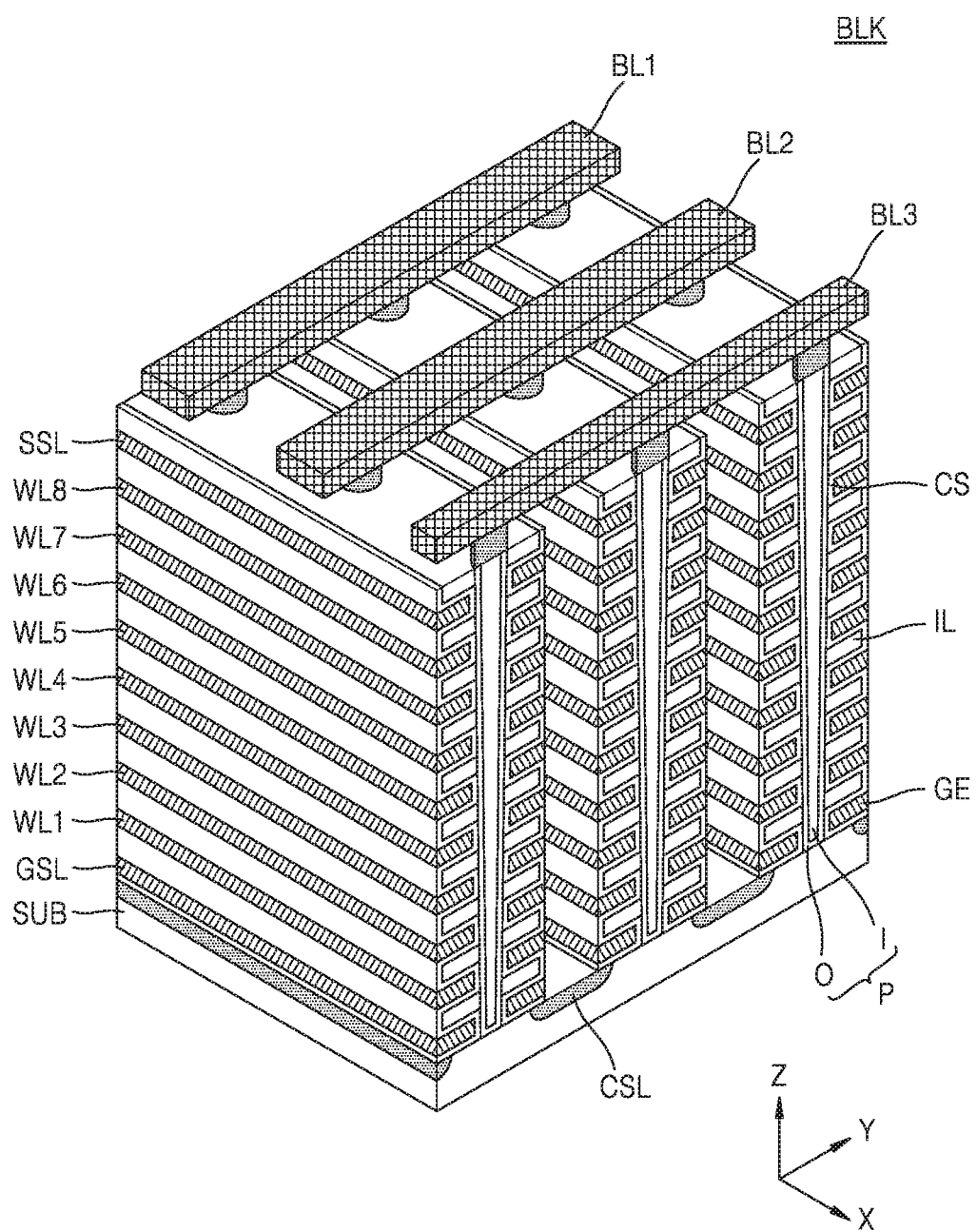
FIG. 8B is a perspective view of the memory block of FIG. 8A, according to an embodiment.

FIG. 8B is a perspective view of the memory block of FIG. 8A, according to an embodiment.

Referring to FIG. 8B, a memory block BLK may be formed in a direction vertical to a substrate SUB. A common source line CSL may be disposed on the substrate SUB, and a plurality of gate electrodes GE and insulation layers IL may be alternately stacked on the substrate SUB. Also, a charge storage layer CS may be formed between adjacent gate electrodes GE and insulation layers IL.

By vertically patterning the plurality of gate electrodes GE and insulation layers IL stacked alternately, a pillar P may be formed. The pillar P may have a V-shape. The pillar P may pass through the gate electrodes GE and the insulation layers IL and may be connected to the substrate SUB. An outer portion O of the pillar P may include a semiconductor material and may function as a channel region, and an inner portion I of the pillar P may include an insulating material such as silicon oxide.

The gate electrodes GE of the memory block BLK may be connected to the ground selection line GSL, the plurality of word lines WL1 to WL8, and the string selection line SSL. Also, the pillar P of the memory block BLK may be connected to a plurality of bit lines BL1 to BL3. In FIG. 8B, the memory block BLK is illustrated as including two selection lines GSL and SSL, eight word lines WL1 to WL8, and three bit lines BL1 to BL3, but is not limited thereto and may include more or fewer lines.

As illustrated in FIGS. 8A and 8B, a position of a word line in a memory block BLK having a 3D vertical structure may affect the strength of the word line. For example, stress applied to word lines (for example, a first word line WL1 adjacent to a ground selection line GSL or an eighth word line WL8 adjacent to a string selection line SSL) disposed at an upper portion or a lower portion of the memory block BLK may be more than stress applied to the other word lines in performing a program operation, a verify operation, and an erase operation due to a structural characteristic of the memory block BLK, and thus, the strength of the word lines may be relatively lower than that of the other word lines. On the other hand, word lines disposed at a center portion of the memory block BLK may be higher in strength than those at edge portions of the memory block BLK. However, embodiments are not limited thereto, and the tendency of a plurality of strengths respectively corresponding to a plurality of word lines may vary based on other factors, such as, for example, a manufacturing process of the memory block BLK, levels of voltages applied to the word lines, etc.

In calculating strengths of a plurality of word lines, a memory controller (110 of FIG. 1) according to an embodiment may consider a position (e.g., center or edge position, position near GSL or SSL, etc. as discussed above) of each of the plurality of word lines in a memory block BLK by reflecting a structural feature of the memory block BLK having the 3D vertical structure.

Figure 9A:
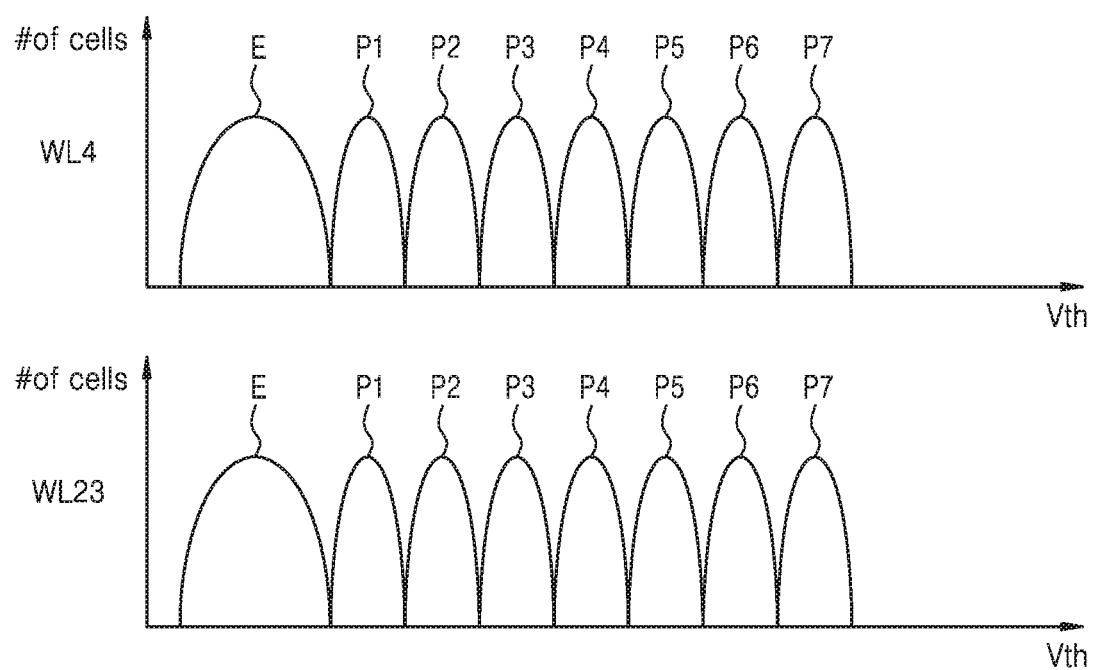
FIG. 9A is a graph showing a threshold voltage distribution of word lines according to various embodiments.
Figure 9B:
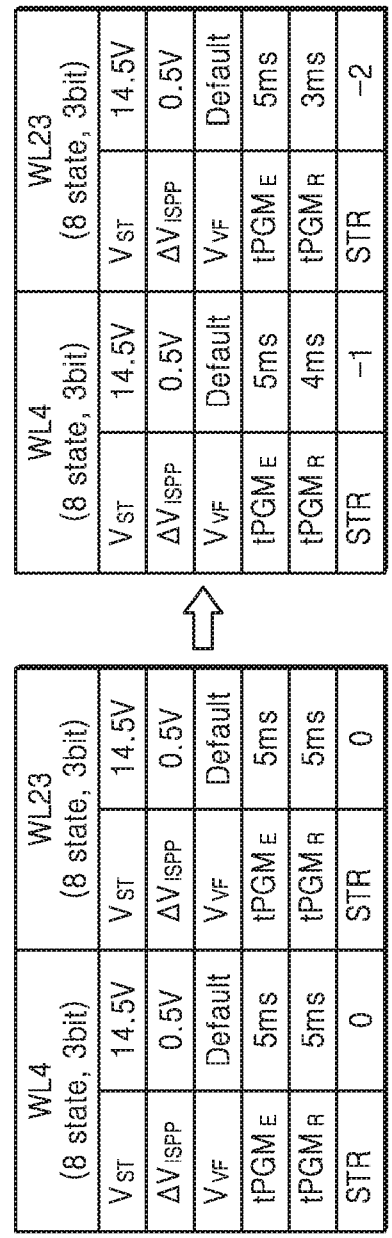
FIG. 9B is a table showing a program parameter and a state metric of each of the word lines of FIG. 9A, according to an embodiment.

FIG. 9A is a graph showing a threshold voltage distribution of word lines according to various embodiments, and FIG. 9B is a table showing a program parameter and a state metric of each of the word lines of FIG. 9A, according to various embodiments. FIG. 9B shows a program parameter variation and a state metric variation each caused by aging of each of word lines.

In FIGS. 9A and 9B, for convenience of description, a threshold voltage distribution of word lines and the table will be described below with reference to a fourth word line WL4 and a twenty-third word line WL23. The fourth word line WL4 and the twenty-third word line WL23 may be disposed at different positions in a memory block or may be disposed adjacent to each other.

Referring to FIG. 9A, eight state counts may be initially allocated to each of the fourth word line WL4 and the twenty-third word line WL23. For example, a memory cell of each of the fourth word line WL4 and the twenty-third word line WL23 may be programmed to one of an erase state E and first to seventh program states P1 to P7 such that 3-bit data may be stored for each memory cell.

Referring to FIG. 9B, program parameters and state metrics of the fourth word line WL4 and the twenty-third word line WL23 may initially be the same. For example, a program start voltage $V_{ST}$, a program voltage difference $\Delta V_{ISPP}$, and a program verify voltage $V_{VF}$ of each of the fourth word line WL4 and the twenty-third word line WL23 may be identically applied. The program start voltage $V_{ST}$, the program voltage difference $\Delta V_{ISPP}$, and the program verify voltage $V_{VF}$ will be described below with reference to FIG. 10.

Figure 10:
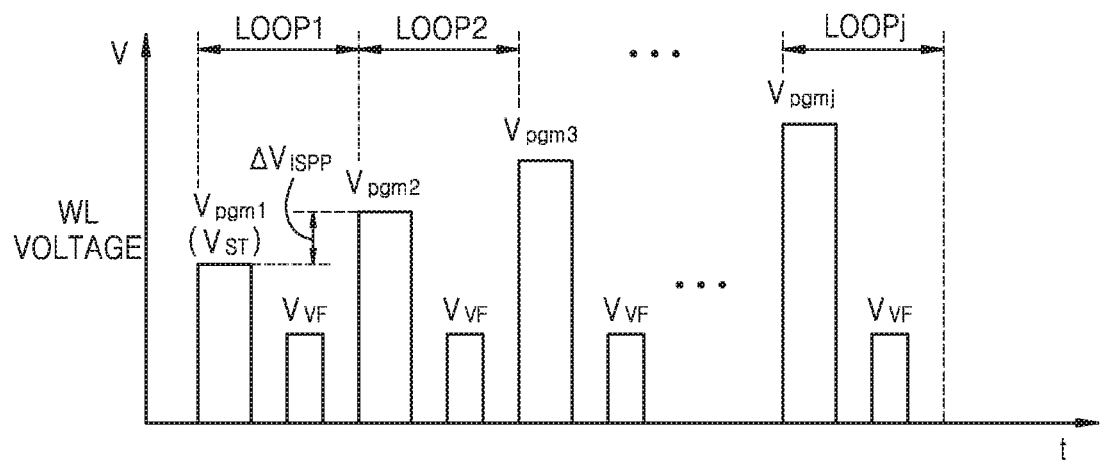
FIG. 10 is a timing diagram showing a program operation of a non-volatile memory according to an embodiment.

FIG. 10 is a timing diagram showing a program operation of a non-volatile memory according to an embodiment. In FIG. 10, the abscissa axis (i.e., the t axis) represents time, and the ordinate axis (i.e., the V axis) represents a voltage which is applied to a word line WL in performing a program operation.

Referring to FIG. 10, the program operation may include a plurality of program loops LOOP1 to LOOPj (where j is a natural number of 2 or more). In each of the plurality of program loops LOOP1 to LOOPj, a program voltage Vpgm1, Vpgm2, Vpgm3, . . . , or Vpgmj (or referred to as a program pulse) may be applied to a word line WL, and a program verify voltage $V_{VF}$ may be applied to the word line WL. Based on incremental step pulse programming (ISPP), voltage levels of the program voltages (for example, first to $j^{th}$ program voltages) Vpgm1, Vpgm2, Vpgm3, . . . , and Vpgmj respectively applied to the program loops (for example, first to $j^{th}$ program loops) LOOP1 to LOOPj may increase.

In the first program loop LOOP1, the first program voltage Vpgm1 applied to the word line WL may be referred to as a program start voltage $V_{ST}$. A voltage difference between program voltages (for example, a voltage difference between the first program voltage Vpgm1 and the second program voltage Vpgm2) may be referred to as a program voltage difference $\Delta V_{ISPP}$. In an embodiment, in continuous program loops, voltage differences between program voltages may be the same. For example, a voltage difference between the first program voltage Vpgm1 and the second program voltage Vpgm2 may be the same as a voltage difference between the second program voltage Vpgm2 and the third program voltage Vpgm3. In another embodiment, in continuous program loops, voltage differences between program voltages may differ. For example, the voltage difference between the second program voltage Vpgm2 and the third program voltage Vpgm3 may be greater than the voltage difference between the first program voltage Vpgm1 and the second program voltage Vpgm2.

The program verify voltage $V_{VF}$ may be a voltage for verifying whether a plurality of memory cells connected to a word line WL are programmed to a target state. When a threshold voltage of a memory cell is higher than the program verify voltage $V_{VF}$, it may be determined that the memory cell is programmed to the target state, and when the threshold voltage of the memory cell is lower than the program verify voltage $V_{VF}$, it may be determined that the memory cell is programmed to the target state.

Referring back to FIG. 9B, an expected program time $tPGM_E$ and a real program time $tPGM_R$ of each of the fourth word line WL4 and the twenty-third word line WL23 initially may identically be 5 ms (see left side of FIG. 9B). A difference between the expected program time $tPGM_E$ and the real program time $tPGM_R$ may be calculated as word line strength STR (or an aging value), and since the expected program time $tPGM_E$ is the same as the real program time $tPGM_R$, the word line strength STR may be 0.

A program operation, a read operation, and an erase operation may be performed on the fourth word line WL4 and the twenty-third word line WL23. The fourth word line WL4 and the twenty-third word line WL23 may be programmed based on the same program parameter. As the program operation, the read operation, and the erase operation are performed, the fourth word line WL4 and the twenty-third word line WL23 may be aged. Therefore, the real program time $tPGM_R$ of the fourth word line WL4 may decrease to 4 ms, and the real program time $tPGM_R$ of the twenty-third word line WL23 may decrease to 3 ms (see right side of FIG. 9B). Due to a difference between the expected program time $tPGM_E$ and the real program time $tPGM_R$, strength STR of the fourth word line WL4 may be calculated as −1, and strength STR of the twenty-third word line WL23 may be calculated as −2.

A process of adjusting a state count and a program parameter of each of the fourth word line WL4 and the twenty-third word line WL23 will be described below with reference to FIGS. 11A and 11B.

Figure 11A:
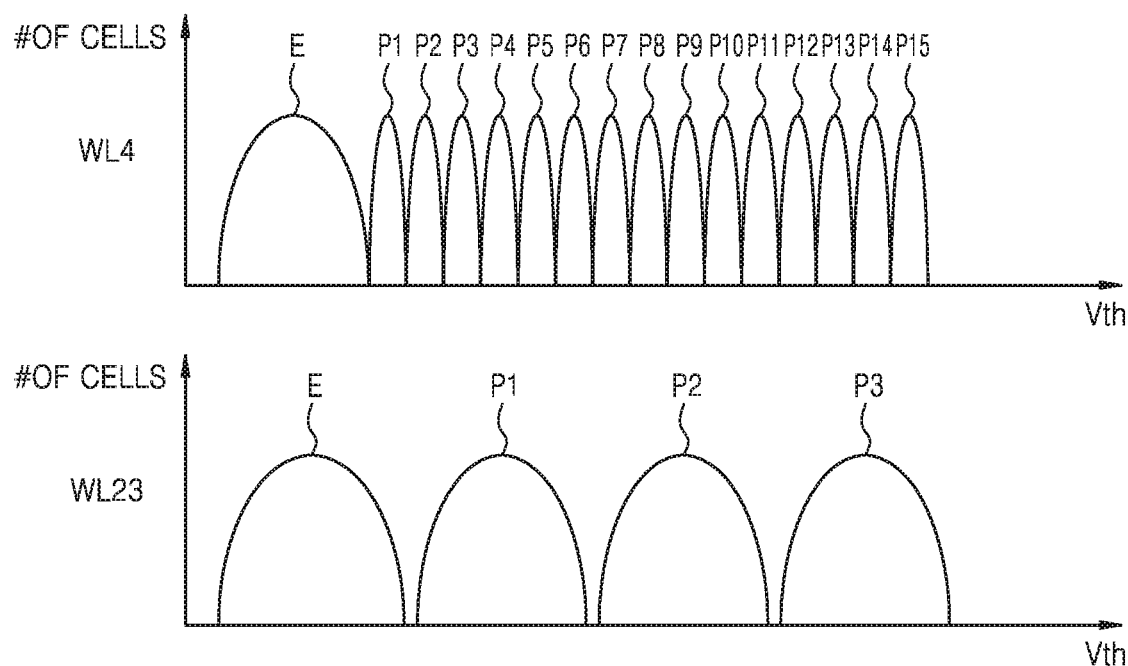
FIG. 11A is a graph showing a threshold voltage distribution of word lines when a state count of each of the word lines is adjusted, according to embodiments.
Figure 11B:
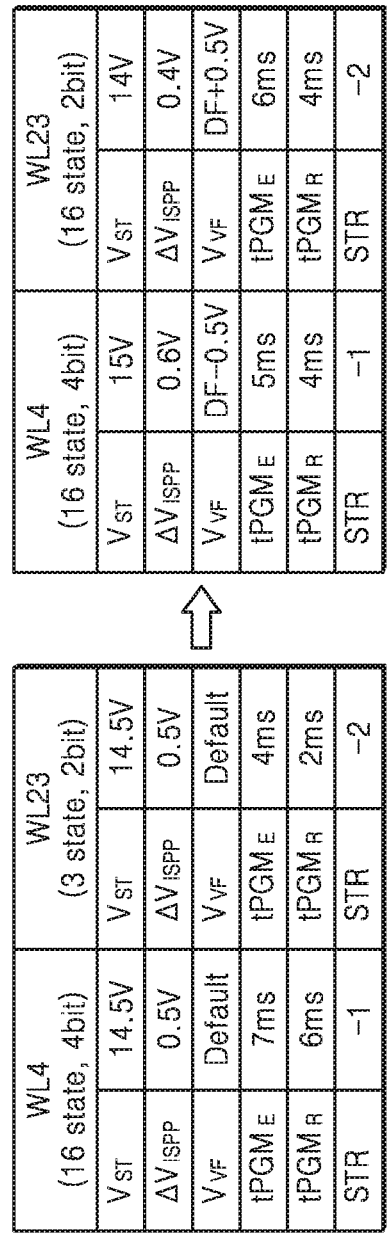
FIG. 11B is a table showing a program parameter and a state metric of each of the word lines of FIG. 11A, according to an embodiment.

FIG. 11A is a graph showing a threshold voltage distribution of word lines when a state count of each of the word lines is adjusted, according to various embodiments, and FIG. 11B is a table showing a program parameter and a state metric of each of the word lines of FIG. 11A, according to various embodiments. FIG. 11B shows adjustment of a program parameter and a state metric variation on the basis of adjusting a state count of each of word lines.

Referring to FIG. 11A, a state count of each of a fourth word line WL4 and a twenty-third word line WL23 may be adjusted. As illustrated in the right side of FIG. 9B, a strength STR of the fourth word line WL4 may be higher than that of the twenty-third word line WL23, and thus, as illustrated in FIG. 11A, a state count of the fourth word line WL4 may increase from eight to sixteen and a state count of the twenty-third word line WL23 may decrease from eight to four. A memory cell of the fourth word line WL4 may be programmed to one of an erase state E and first to fifteenth program states P1 to P15, and a memory cell of the twenty-third word line WL23 may be programmed to one of the erase state E and the first to third program states P1 to P3.

As described above with reference to FIG. 9A, before a state count is adjusted, 3-bit data may be stored in a memory cell of each of the fourth word line WL4 and the twenty-third word line WL23, and thus, 6-bit data may be stored in two memory cells of the fourth word line WL4 and the twenty-third word line WL23. After the state count is adjusted, 4-bit data may be stored in the memory cell of the fourth word line WL4 and 2-bit data may be stored in the memory cell of the twenty-third word line WL23, and thus, 6-bit data may be stored in the two memory cells of the fourth word line WL4 and the twenty-third word line WL23. Before and after the state count is adjusted, the amount of data stored in the fourth word line WL4 and the twenty-third word line WL23 may not vary.

Referring to FIG. 11B, based on adjustment of a state count, an expected program time $tPGM_E$ of a fourth word line WL4 may increase to 7 ms, and an expected program time $tPGM_E$ of a twenty-third word line WL23 may decrease to 4 ms (see left side of FIG. 11B). A strength STR before adjusting a state count may be the same as strength STR after adjusting the state count, and thus, a real program time $tPGM_R$ of the fourth word line WL4 may be 6 ms and a real program time $tPGM_R$ of the twenty-third word line WL23 may be 2 ms. In order to decrease a difference between the real program times $tPGM_R$ of the fourth word line WL4 and the twenty-third word line WL23, program parameter(s) of the fourth word line WL4 and/or the twenty-third word line WL23 may be adjusted.

For example, as illustrated in FIG. 11B, a program start voltage $V_{ST}$ of the fourth word line WL4 may increase from 14.5 V to 15 V, a program voltage difference $\Delta V_{ISPP}$ thereof may increase from 0.5 V to 0.6 V, and a program verify voltage $V_{VF}$ thereof may decrease by 0.5 V from a default voltage DF. Therefore, an expected program time $tPGM_E$ of the fourth word line WL4 may decrease to 5 ms, and an real program time $tPGM_R$ thereof may decrease to 4 ms. Also, a program start voltage $V_{ST}$ of the twenty-third word line WL23 may decrease from 14.5 V to 14 V, a program voltage difference $\Delta V_{ISPP}$ thereof may decrease from 0.5 V to 0.4 V, and a program verify voltage $V_{VF}$ thereof may increase by 0.5 V from the default voltage DF. Therefore, an expected program time $tPGM_E$ of the twenty-third word line WL23 may increase to 6 ms, and an real program time $tPGM_R$ thereof may increase to 4 ms. By adjusting program parameters of the fourth word line WL4 and the twenty-third word line WL23, the real program times $tPGM_R$ of the fourth word line WL4 and the twenty-third word line WL23 may be the same or similar.

In FIG. 11B, an embodiment where a program parameter is adjusted to decrease the real program times $tPGM_R$ of the fourth word line WL4 and increase the real program times $tPGM_R$ of the twenty-third word line WL23 is described, but is not limited thereto. In another embodiment, a program parameter of the fourth word line WL4 may be adjusted to decrease the real program times $tPGM_R$ of the fourth word line WL4, and a program parameter of the twenty-third word line WL23 may be maintained as the same value. In another embodiment, the program parameter of the fourth word line WL4 may be maintained as the same value, and the program parameter of the twenty-third word line WL23 may be adjusted to increase the real program times $tPGM_R$ of the twenty-third word line WL23.

An embodiment, where a state count of each of the fourth word line WL4 and the twenty-third word line WL23 is adjusted to $2^s$ (where s is a natural number) and thus integer-bit data is stored in a memory cell of each of the fourth word line WL4 and the twenty-third word line WL23, has been described above with reference to FIGS. 11A and 11B. However, embodiments are not limited thereto, and the state count of each of the fourth word line WL4 and the twenty-third word line WL23 may be adjusted so that fractional-bit data is stored in the memory cell of each of the fourth word line WL4 and the twenty-third word line WL23. This will be described below with reference to FIGS. 12A to 14B.

Figure 12A:
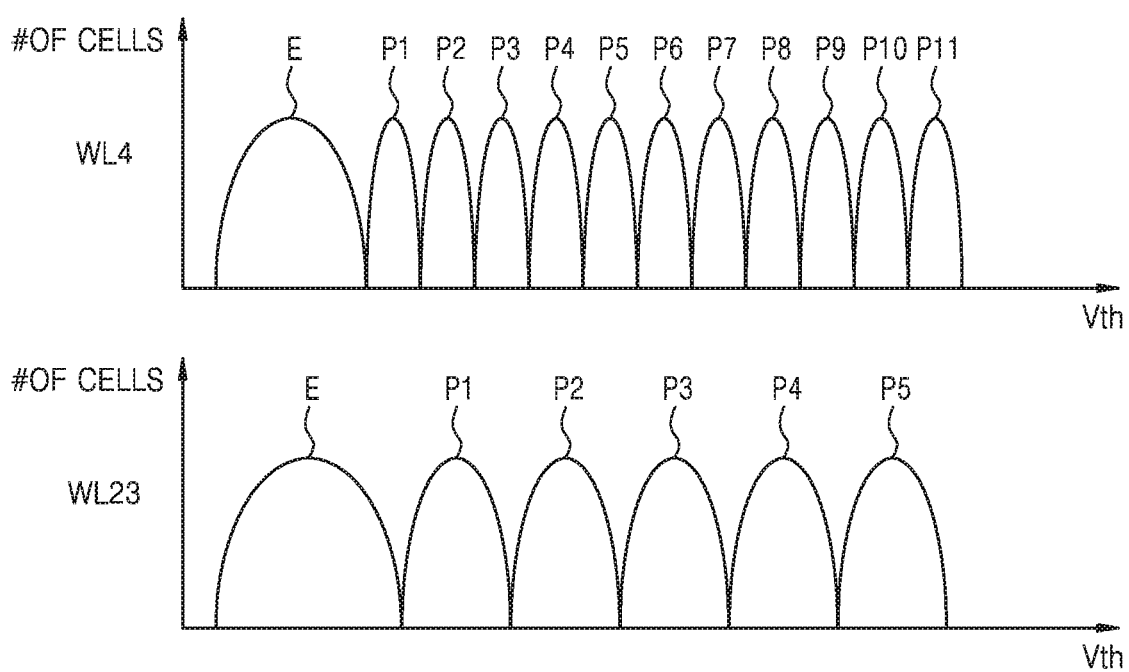
FIG. 12A is a graph showing a threshold voltage distribution of word lines when a state count of word lines is adjusted, according to embodiments.
Figure 12B:
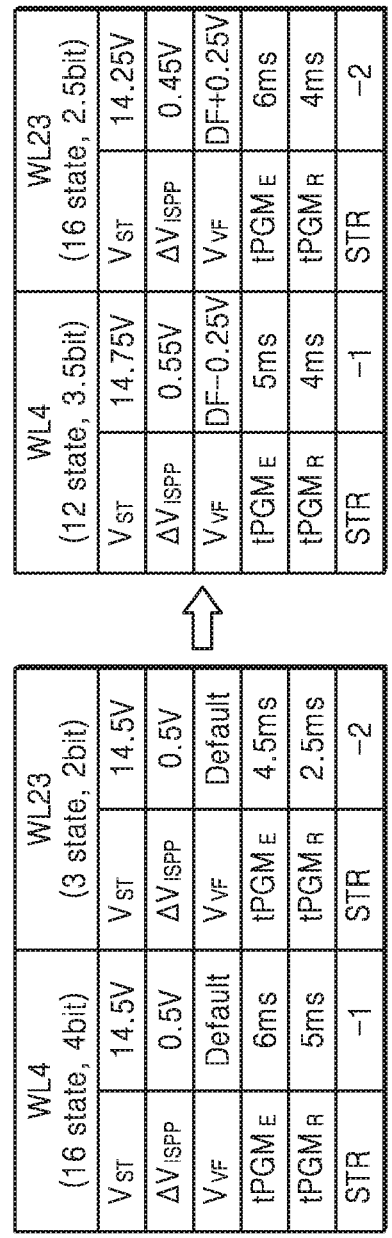
FIG. 12B is a table showing a program parameter and a state metric of each of the word lines of FIG. 12A, according to an embodiment.

FIG. 12A is a graph showing a threshold voltage distribution of word lines when a state count of word lines is adjusted, according to various embodiments, and FIG. 12B is a table showing a program parameter and a state metric of each of the word lines of FIG. 12A, according to various embodiments. FIG. 12B shows adjustment of a program parameter and a state metric variation based on adjusting a state count of each of word lines.

Referring to FIG. 12A, a state count of each of a fourth word line WL4 and a twenty-third word line WL23 may be adjusted. As discussed above with respect to FIG. 9B, a strength STR of the fourth word line WL4 may be higher than that of the twenty-third word line WL23, and thus, as illustrated in FIG. 12A, a state count of the fourth word line WL4 may increase from eight to eleven and a state count of the twenty-third word line WL23 may decrease from eight to six. A memory cell of the fourth word line WL4 may be programmed to one of an erase state E and first to eleventh program states P1 to P11, and a memory cell of the twenty-third word line WL23 may be programmed to one of the erase state E and the first to fifth program states P1 to P5. Thus, 3.5-bit data may be stored in a memory cell of the fourth word line WL4, and 2.5-bit data may be stored in the twenty-third word line WL23, whereby data of total 6 bits may be stored in two memory cells of the fourth word line WL4 and the twenty-third word line WL23.

As described above with reference to FIG. 9A, before a state count is adjusted, 6-bit data may be stored in the two memory cells of the fourth word line WL4 and the twenty-third word line WL23. Therefore, before and after the state count is adjusted, the amount of data stored in the fourth word line WL4 and the twenty-third word line WL23 may not vary. A method of storing a fractional bit in a memory cell of a word line will be described below with reference to FIGS. 13 to 14B.

Referring to FIG. 12B, based on adjustment of a state count, an expected program time $tPGM_E$ of a fourth word line WL4 may increase to 6 ms, and an expected program time $tPGM_E$ of a twenty-third word line WL23 may decrease to 4.5 ms. A strength STR before adjusting a state count may be the same as strength STR after adjusting the state count, and thus, a real program time $tPGM_R$ of the fourth word line WL4 may be 5 ms and a real program time $tPGM_R$ of the twenty-third word line WL23 may be 2.3 ms. In order to decrease a difference between the real program times $tPGM_R$ of the fourth word line WL4 and the twenty-third word line WL23, program parameter(s) of the fourth word line WL4 and/or the twenty-third word line WL23 may be adjusted.

For example, as illustrated in FIG. 12B, a program start voltage $V_{ST}$ of the fourth word line WL4 may increase from 14.5 V to 14.75 V, a program voltage difference $\Delta V_{ISPP}$ thereof may increase from 0.5 V to 0.55 V, and a program verify voltage $V_{VF}$ thereof may decrease by 0.25 V from a default voltage DF. Therefore, an expected program time $tPGM_E$ of the fourth word line WL4 may decrease to 5 ms, and an real program time $tPGM_R$ thereof may decrease to 4 ms. Also, a program start voltage $V_{ST}$ of the twenty-third word line WL23 may decrease from 14.5 V to 14.25 V, a program voltage difference $\Delta V_{ISPP}$ thereof may decrease from 0.5 V to 0.45 V, and a program verify voltage $V_{VF}$ thereof may increase by 0.25 V from the default voltage DF. Therefore, an expected program time $tPGM_E$ of the twenty-third word line WL23 may increase to 6 ms, and an real program time $tPGM_R$ thereof may increase to 4 ms. By adjusting program parameters of the fourth word line WL4 and the twenty-third word line WL23, the real program times $tPGM_R$ of the fourth word line WL4 and the twenty-third word line WL23 may be the same or similar.

Figures 13, 14A:
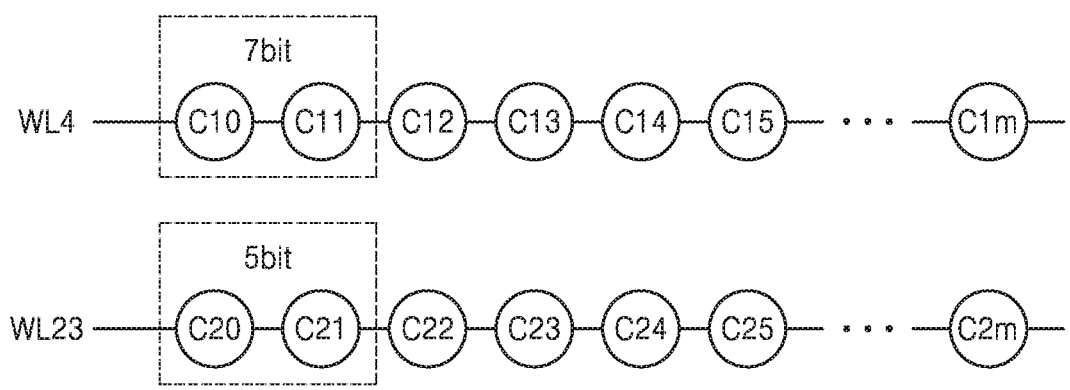
FIG. 13 is a table describing a method of storing a fractional bit in each memory cell, according to an embodiment.
FIGS. 14A and 14B describe method of storing a fractional bit in each memory cell, according to various embodiments.

FIG. 13 is a table describing a method of storing a fractional bit in each memory cell, according to an embodiment.

FIG. 13 illustrates an embodiment where data of total 5 bits is stored in a first memory cell MC1 and a second memory cell MC2 and 2.5-bit data is stored in each memory cell.

Referring to FIG. 13, the first memory cell MC1 and the second memory cell MC2 may be paired (or grouped), and a program operation and a read operation may be performed thereon. Also, thirty-two states ($2^5$=32) corresponding to 5-bit data may be calculated based on five states (for example, an erase state E and a combination of first to fifth program states P1 to P5) allocated to each of the first memory cell MC1 and the second memory cell MC2. Total thirty-six states may be calculated based on the multiplication of six states of the first memory cell MC1 and six states of the second memory cell MC2, and thirty-two states (for example, first to thirty-second state S0 to S31) except four states among the thirty-six states may correspond to thirty-two states (for example, an erase state E and first to thirty-first program states P1 to P31) corresponding to 5-bit data.

Therefore, the encoding and decoding module 115 of the memory controller 110 (see FIG. 5) may determine the first memory cell MC1 and the second memory cell MC2 as a pair and may perform encoding and decoding thereon. In the non-volatile memory 120, a program operation and a read operation may be simultaneously performed on the first memory cell MC1 and the second memory cell MC2, and thus, 2.5-bit data may be stored in and read from each of the first memory cell MC1 and the second memory cell MC2.

FIG. 13 illustrates an embodiment where 5-bit data is stored in two memory cells, and thus, fractional-bit data of 2.5 bits is stored in a memory cell. However, embodiments are not limited thereto, and a program operation and a read operation may be performed on a group of three or more memory cells and fractional-bit data may be stored in each memory cell. This will be described. Equation 1 has to be satisfied for storing fractional-bit data.

$$\Pi_{k=1}^{n} S_k \geq 2^B \quad \text{[Equation 1]}$$

Here, n may be a natural number of 2 or more and may represent the number of memory cells on which a program operation and a read operation are to be simultaneously performed, $S_k$ may represent a state count allocated to a kth (where k is a natural number of 1 to n) memory cell, and B may represent the total number of bits to be stored in memory cells. For example, in a case where data of total 5 bits is stored in two memory cells, the multiplication of state counts S1 and S2 allocated to each of the two memory cells has to be $2^5$ (i.e., 32) or more. As illustrated in FIG. 13, the state counts S1 and S2 allocated to the first memory cell MC1 and the second memory cell MC2 may be 6, and thus, according to Equation 1, $\Pi_{k=1}^{2} S_k$ may be 36 and may be 32 or more. Therefore, data of total 5 bits may be stored in the first memory cell MC1 and the second memory cell MC2. For example, in a case where five states and eight states or six states and seven states are respectively allocated to the first memory cell MC1 and the second memory cell MC2, Equation 1 may be satisfied, and data of total 5 bits may be stored in the first memory cell MC1 and the second memory cell MC2.

Figure 14B:
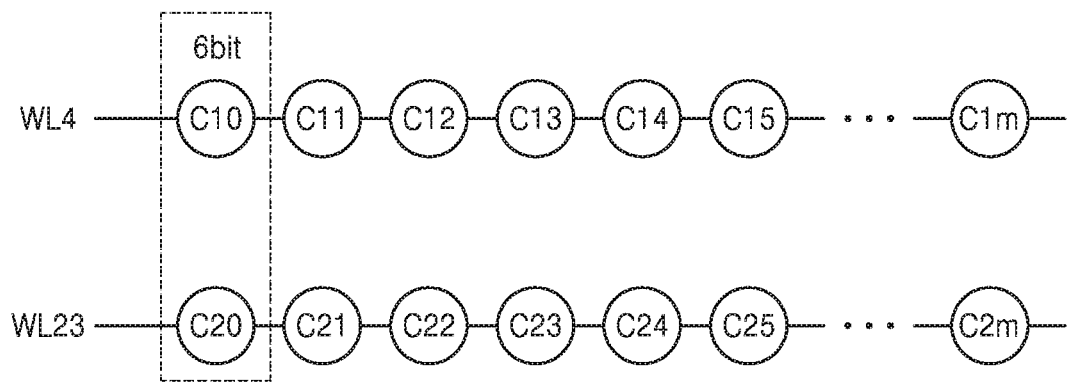

FIGS. 14A and 14B describe a method of storing a fractional bit in each memory cell, according to an embodiment.

As described above with reference to FIG. 13, in order to store fractional-bit data in each memory cell, a plurality of memory cells operate as a pair or a group and a program operation and a read operation are performed on the plurality of memory cells.

FIG. 14A illustrates an embodiment where two memory cells of one word line operate as a pair, and FIG. 14B illustrates an embodiment where two memory cells of two word lines operate as a pair.

Referring to FIG. 14A, a plurality of memory cells C10 to C1m (where m is a positive even number) may be included in a fourth word line WL4, and a plurality of memory cells C20 to C2m may be included in a twenty-third word line WL23. In the plurality of memory cells C10 to C1m of the fourth word line WL4, every two memory cells (for example, C10 and C11, C12 and C13, etc.) may operate as a pair, and 7-bit data may be stored in each pair of two memory cells. In other words, 7-bit data may be stored in C10 and C11, and 7-bit data may be stored in C12 and C13, and so on. For example, in a case where twelve states are allocated to the fourth word line WL4, the multiplication of state counts allocated to C10 and C11 may be 144. 144 may be greater than 128 ($=2^7$) and less than 256 ($=2^8$). Therefore, 7-bit data may be stored in the pair of C10 and C11, and thus, 3.5-bit data may be stored in each of C10 and C11.

In the plurality of memory cells C20 to C2m of the twenty-third word line WL23, every two memory cells (for example, C30 and C31, C32 and C33, etc.) may operate as a pair, and 5-bit data may be stored in each pair of two memory cells. For example, in a case where six states are allocated to the twenty-third word line WL23, the multiplication of state counts allocated to C20 and C21 may be 36. 36 may be greater than 32 ($=2^5$), and less than 64 ($=2^6$). Therefore, 5-bit data may be stored in each pair of C20 and C21, and thus, 2.5-bit data may be stored in each of C20 and C21.

As described above, in performing a program operation, 3.5-bit data may be stored in a memory cell of the fourth word line WL4 (for example, C10) and 2.5 bit data may be stored in a memory cell of the twenty-third word line WL23 (for example, C20), and thus, data of total 6 bits may be stored in the two memory cells of the fourth word line WL4 and the twenty-third word line WL23. Therefore, even when a state count of the fourth word line WL4 is adjusted from eight to twelve or a state count of the twenty-third word line WL23 is adjusted from eight to six, the amount of data stored in the fourth word line WL4 and the twenty-third word line WL23 may be the same before and after adjusting a state count.

As described above, FIG. 14A illustrates an embodiment where two memory cells of one word line operate as a pair, according to various embodiments. However, embodiments are not limited to this, and FIG. 14B illustrates an embodiment where two memory cells of two word lines operate as a pair, according to various embodiments.

Referring to FIG. 14B, one memory cell in each of the fourth word line WL4 and the twenty-third word line WL23 may operate as a pair. For example, C10 of the fourth word line WL4 and C20 of the twenty-third word line WL23 may operate as a pair, C11 and C21 may operate as a pair, and so on. In other words, C10 of the fourth word line WL4 and C20 of the twenty-third word line WL23 may be simultaneously programmed and read. For example, when twelve state counts are allocated to the fourth word line WL4 and six state counts are allocated to the twenty-third word line WL23, the multiplication of state counts allocated to C10 and C20 may be 72 ($=12 \times 6$). Since 72 is greater than 64 ($=2^6$) and less than 128 ($=2^7$), data of total 6 bits may be stored in the pair of C10 and C20, and thus, 3.5 bits may be stored in C10 and 2.5 bits may be stored in C20. As another example, when eleven state counts are allocated to the fourth word line WL4 and six state counts are allocated to the twenty-third word line WL23, the multiplication of state counts allocated to C10 and C20 may be 66 ($=11 \times 6$). Since 66 is greater than 64 ($=2^6$) and less than 128 ($=2^7$), data of total 6 bits may be stored in C10 and C20.

Therefore, even when a state count of the fourth word line WL4 is adjusted from eight to twelve or eleven, or a state count of the twenty-third word line WL23 is adjusted from eight to six, the amount of data stored in the fourth word line WL4 and the twenty-third word line WL23 may be the same before and after adjusting a state count.

As described above with reference to FIGS. 13 to 14B, by adjusting a state count, a state count differing from $2^s$ may be allocated to a word line, adjustment of a state count may be more precisely performed than a case where $2^s$ state counts are allocated, and wear-leveling may be more easily performed on each word line.

Figure 15A:
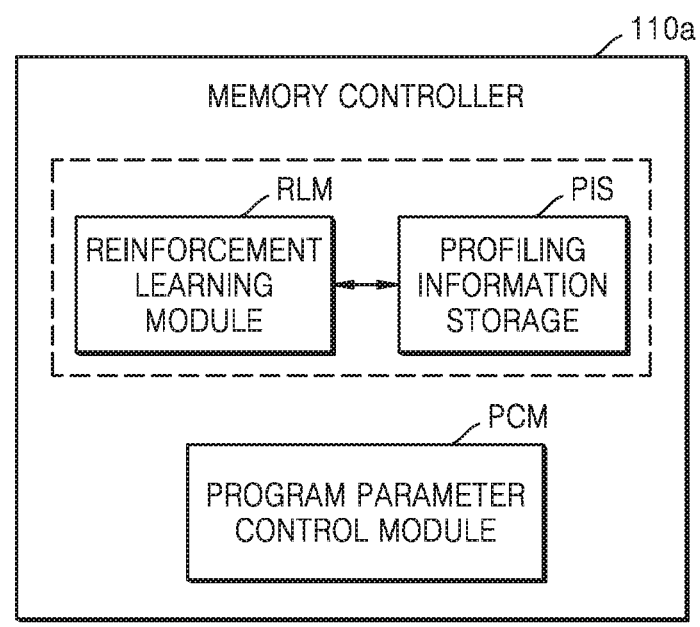
FIG. 15A is a block diagram representing a memory controller according to an embodiment.
Figure 15B:
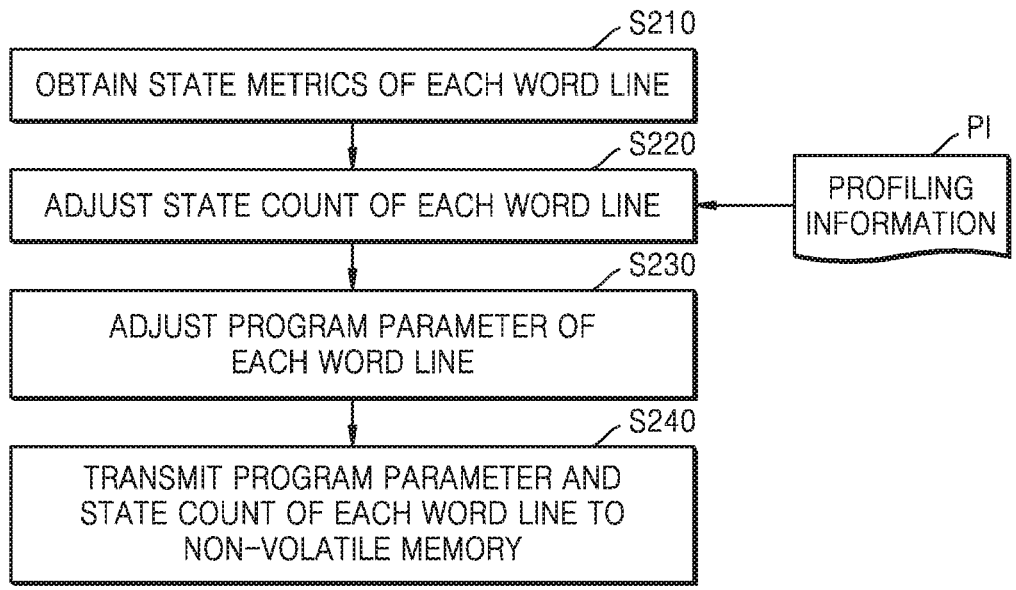
FIG. 15B is a flowchart of an operating method of the memory controller of FIG. 15A, according to an embodiment.

FIG. 15A is a block diagram representing a memory controller 110a according to an embodiment, and FIG. 15B is a flowchart of an operating method of the memory controller 110a of FIG. 15A, according to an embodiment.

Referring to FIG. 15A, the memory controller 110a may include a reinforcement learning module RLM, a profiling information storage PIS, and a program parameter control module PCM.

The reinforcement learning module RLM may adjust a state count of each of a plurality of word lines through reinforcement learning. The reinforcement learning module RLM may perform adjustment of a state count by using word line strength as a feature. As described above with reference to FIG. 3B, in word line strength, an expected program time may be calculated based on a program parameter (for example, at least one of a program start voltage, a program voltage difference, and a program verify voltage), and a strength of a corresponding word line may be calculated based on the expected program time and a real program time. Also, a feature (for example, a read level shifting value, a read error bit, etc.) associated with a condition for performing a read operation may be considered in a process of calculating strength of a word line.

The reinforcement learning module RLM may be implemented as firmware for example, stored in a ROM (114 of FIG. 5), loaded in the RAM 112 at a runtime of a storage device (100 of FIG. 1), and executed by the processor 111.

The profiling information storage PIS may store previously profiled characteristic information (for example, configuration information, initial value information about a state count of each of a plurality of word lines, and threshold value information about a state count capable of being allocated to a word line). For example, the RAM 112 of the memory controller 110 (see FIG. 5) may operate as the profiling information storage PIS. For example, the profiled characteristic information may be stored in a non-volatile memory (120 of FIG. 1) or the ROM (114 of FIG. 5), and when the storage device (100 of FIG. 1) is booted, the profiled characteristic information may be loaded into the RAM 112.

When a program time variation between a plurality of word lines increases by adjusting a state count, the program parameter control module PCM may adjust a program parameter to decrease the program time variation.

Referring to FIG. 15B, the memory controller 110a may obtain state metrics of each of a plurality of word lines in operation S210. The memory controller 110a may store a real program time, an erase time, a read time, a read error bit, a read level shift value, and a state count.

In operation S220, the reinforcement learning module RLM may adjust a state count of each of the plurality of word lines on the basis of a program parameter and the state metrics which are obtained in operation S210. In this case, the reinforcement learning module RLM may perform reinforcement learning on the basis of profiling information PI, and thus, may prevent the reinforcement learning from being performed in an unexpected direction (for example, a direction for increasing a strength difference between the plurality of word lines). For example, the reinforcement learning module RLM may perform the reinforcement learning on the basis of an initial state count of each of the plurality of word lines. As another example, the reinforcement learning module RLM may perform the reinforcement learning on threshold value information about a state count capable of being allocated to a word line, and for example, may perform the reinforcement learning on a state count capable of being maximally allocated to one word line or a threshold value of a difference between state counts of the plurality of word lines. Therefore, the reinforcement learning may be prevented from being performed under a worst condition.

The program parameter control module PCM may adjust a program parameter of each of the plurality of word lines on the basis of adjustment of a state count in operation S230, and the memory controller 110 may transmit the state count and the program parameter of each of the plurality of word lines to the non-volatile memory 120 in operation S240.

Figure 16:
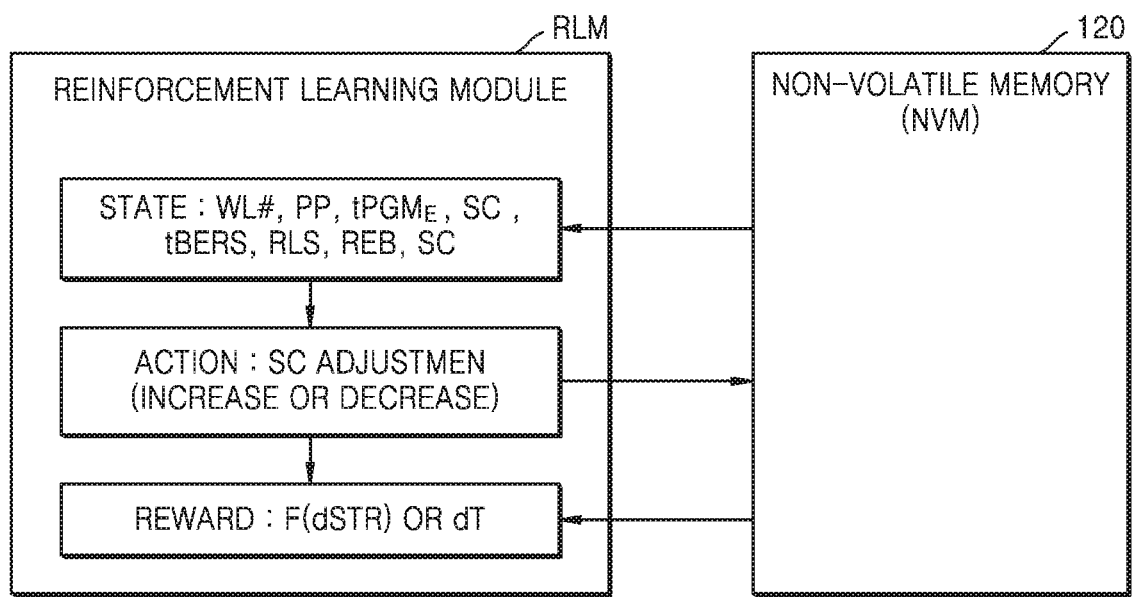
FIG. 16 illustrates an operating method of a reinforcement learning module according to an embodiment.

FIG. 16 illustrates an operating method of a reinforcement learning module RLM according to an embodiment.

Referring to FIG. 16, the reinforcement learning module RLM may set a state of reinforcement learning on the basis of condition information about each of a plurality of word lines of a non-volatile memory 120. For example, features such as a program parameter PP, an expected program time $tPGM_E$, and a state count SC of each word line may be set to a state of the reinforcement learning. Also, an erase time tBERS, a read level shift value RLS, and a read error bit REB which are additional features may be set to a state of the reinforcement learning. A strength STR (or an aging level) of a word line may be determined based on the program parameter PP and the expected program time $tPGM_E$.

The reinforcement learning module RLM may perform adjustment (increase or decrease) of a state count of each word line, and for example, the adjustment of a state count of each of a plurality of word lines may be performed as an action of the reinforcement learning. The reinforcement learning module RLM may perform an action to maximize a reward on the basis of a state of the reinforcement learning. Accordingly, the state count of each of the plurality of word lines may increase or decrease. As described above with reference to FIGS. 4A and 4B, a program time variation ΔtPGM or a P/E cycle of a plurality of word lines may be set as a trigger condition for performing an action.

A reward of the reinforcement learning may be set based on a strength difference dSTR between the plurality of word lines calculated based on the features used to set the state of the reinforcement learning. For example, a function value F(dSTR) calculated based on the strength difference dSTR may be set as a reward. The reinforcement learning module RLM may perform an action to maximize the function value F(dSTR), in other words, to minimize the strength difference dSTR between the plurality of word lines.

In an embodiment, when the program time variation ΔtPGM is set as a trigger condition for performing an action, a time difference dT between actions (for example, a time taken until adjustment of a state count is performed and then adjustment of a state count is again performed) may be set as a reward. When adjustment of a state count is appropriately performed, the time difference dT between the actions may increase.

Figure 17A:
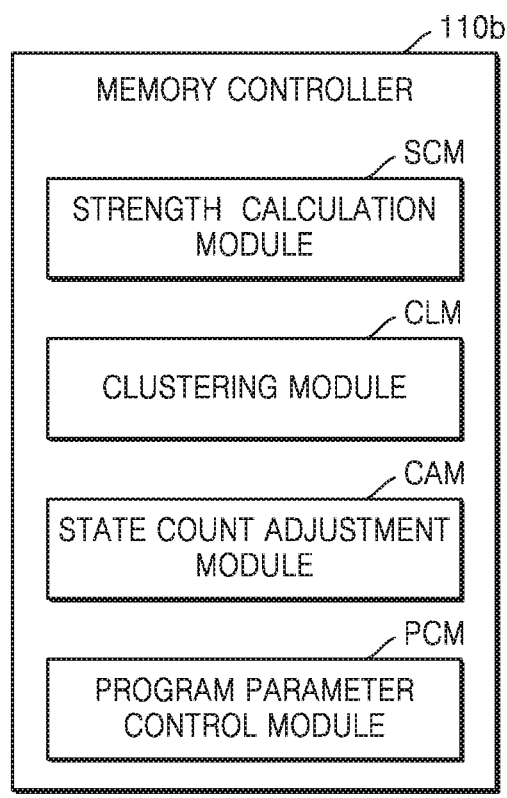
FIG. 17A is a block diagram representing a memory controller according to an embodiment.
Figure 17B:
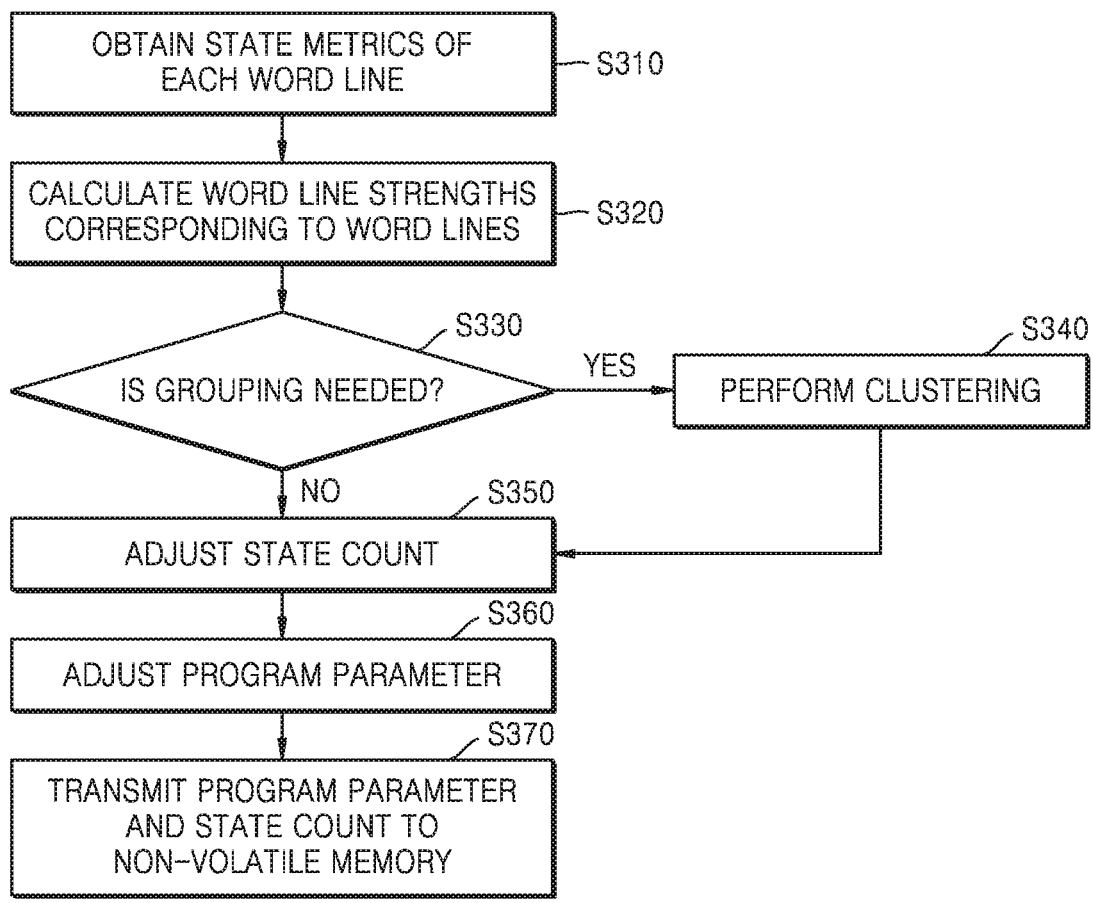
FIG. 17B is a flowchart of an operating method of the memory controller of FIG. 17A, according to an embodiment.

FIG. 17A is a block diagram representing a memory controller according to an embodiment, and FIG. 17B is a flowchart of an operating method of the memory controller of FIG. 17A, according to an embodiment.

FIG. 17A is an modified embodiment of FIG. 3A, and the operating method of FIG. 17B may be a modified embodiment of the method of FIG. 3B. Therefore, repeated description of like elements will be omitted for conciseness and a difference will be mainly described below.

Referring to FIG. 17A, the memory controller 110b may include a strength calculation module SCM, a clustering module CLM, a state count adjustment module CAM, and a program parameter control module PCM.

The strength calculation module SCM, the state count adjustment module CAM, and the program parameter control module PCM have been described above with reference to FIG. 3A, and thus, their repetitive descriptions are omitted for conciseness.

The clustering module CLM may perform clustering on the basis of a characteristic (for example, word line strength) of each of a plurality of word lines, and thus, may group the plurality of word lines into a plurality of word line groups. The state count adjustment module CAM may adjust a state count of each of the plurality of word line groups, and the program parameter control module PCM may adjust a program parameter of each of the plurality of word line groups.

Referring to FIG. 17B, the memory controller 110 may obtain state metrics of each of a plurality of word lines in operation S310. The state metrics may include, for example, a real program time, an erase time, a read time, a read error bit, a read level shift value, and/or a state count.

The strength calculation module SCM may calculate a plurality of word line strengths respectively corresponding to the plurality of word lines in operation S320. The strength calculation module SCM may calculate strength of a word line on the basis of a program parameter and the state metrics which are obtained in operation S310.

The clustering module CLM may determine whether grouping of the plurality of word lines is needed in operation S330, and when the grouping is needed (S330, YES), clustering may be performed based on a characteristic (for example, word line strength) of each of the plurality of word lines in operation S340. The plurality of word lines may be grouped into a plurality of word line groups.

For example, when the number of word lines managed for adjusting a state count is equal to or more than a threshold number, a load of the state count adjustment module CAM may increase, and the amount of information (for example, the amount of data needed for obtaining a state metric) to be managed may be large. When the number of word lines is equal to or more than the threshold number, the clustering module CLM may determine that grouping is needed, and the clustering module CLM may perform grouping on the basis of clustering (i.e., a clustering technique) based on the characteristic of each of the plurality of word lines.

The clustering may be performed by using, for example, at least one of a K-means clustering algorithm, a K-medoids clustering algorithm, a hierarchical clustering algorithm, a density-based clustering algorithm, and a neural network algorithm.

The state count adjustment module CAM may adjust a state count in operation S350. The state count adjustment module CAM may adjust a state count of each of the plurality of word line groups on the basis of the plurality of word line strengths respectively corresponding to the plurality of word line groups. When the clustering of operation S340 is not performed, the state count adjustment module CAM may adjust a state count by units of word lines.

The program parameter control module PCM may adjust a program parameter of each of the plurality of word line groups or the plurality of word lines in operation S360.

The memory controller 110 may transmit a program parameter and a state count of each of the plurality of word line groups or the plurality of word lines to the non-volatile memory 120 in operation S370.

Figure 18A:
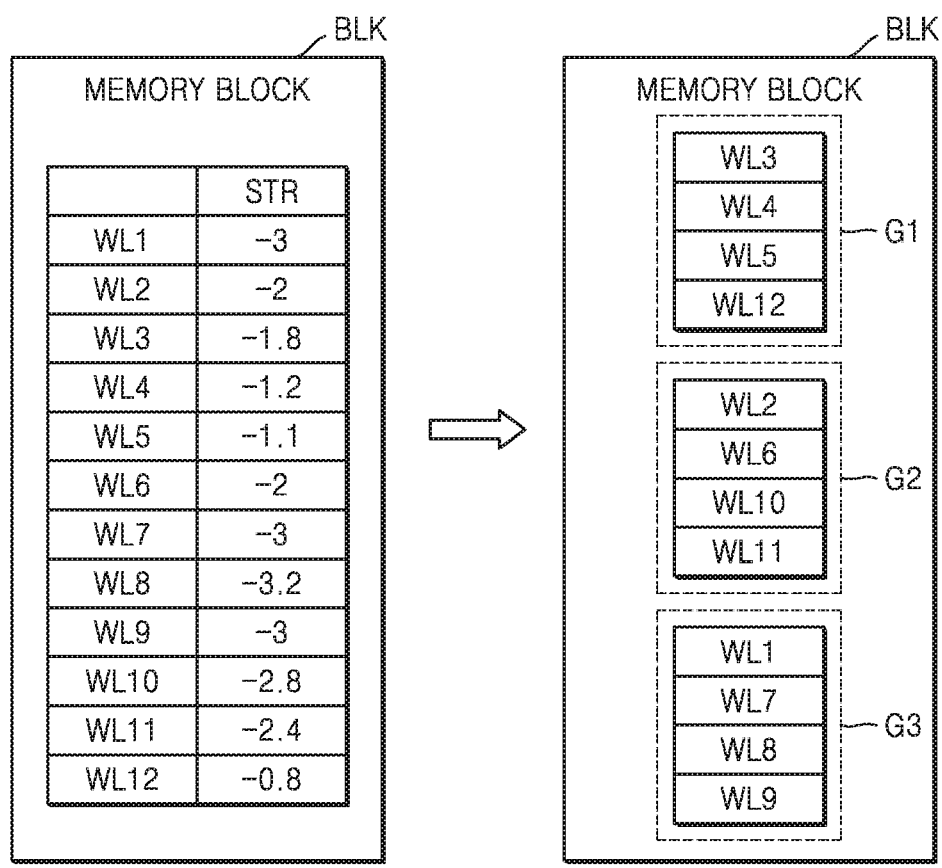
FIGS. 18A and 18B illustrate grouping of a plurality of word lines according to various embodiments.
Figure 18B:
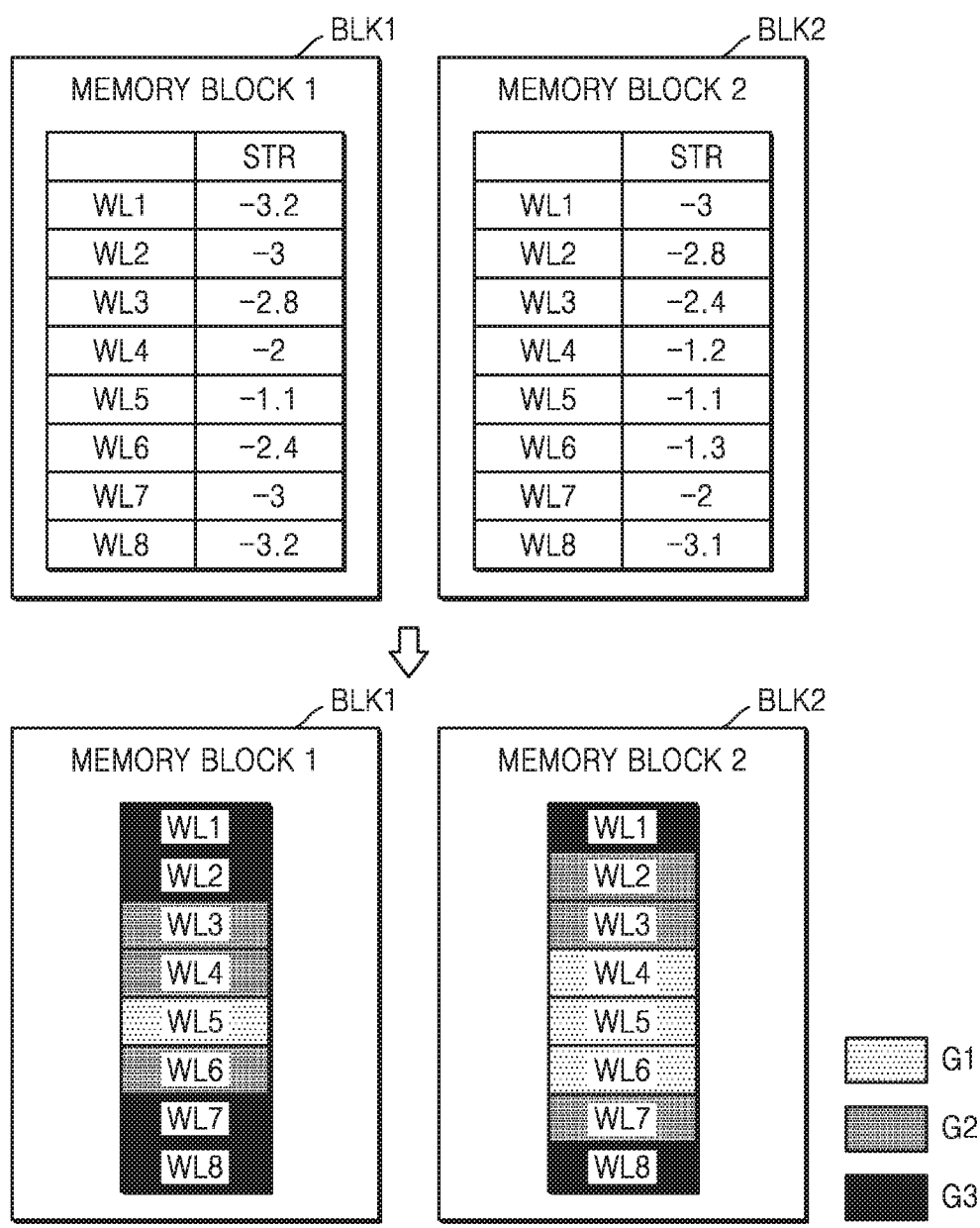

FIGS. 18A and 18B illustrate grouping of a plurality of word lines according to an embodiment.

Referring to FIG. 18A, adjustment of a state count may be performed by units of one memory block BLK, and a plurality of word lines (for example, first to twelfth word lines WL1 to WL12) included in a memory block BLK may be grouped into a plurality of word line groups.

The plurality of word lines (for example, the first to twelfth word lines WL1 to WL12) may have different strengths STR, and a clustering module (e.g., the clustering module CLM of FIG. 17A) of a memory controller (e.g., the memory controller 110b of FIG. 17A) may perform clustering on the basis of the strengths STR to group the first to twelfth word lines WL1 to WL12 into a plurality of word line groups (for example, a first group G1, a second group G2, and a third group G3). For example, the clustering module CLM may set a clustering criterion on the basis of a strength STR distribution of the first to twelfth word lines WL1 to WL12. For example, the clustering module CLM may group a plurality of word lines, having strength STR equal to or less than 0 and higher than −2, into a first group G1, group a plurality of word lines, having strength STR equal to or less than −2 and higher than −3, into a second group G2, and group a plurality of word lines, having strength STR equal to or less than −3, into a third group G3. Therefore, the third word line WL3, the fourth word line WL4, the fifth word line WL5, and the twelfth word line WL12 may be grouped into the first group G1, and the second word line WL2, the sixth word line WL6, the tenth word line WL10, and the eleventh word line WL11 may be grouped into the second group G2, and the first word line WL1, the seventh word line WL7, the eighth word line WL8, and the ninth word line WL9 may be grouped into the third group G3.

Referring to FIG. 18B, adjustment of a state count may be performed by units of memory blocks (for example, first and second memory blocks) BLK1 and BLK2, and a plurality of word lines included in the memory blocks (for example, first and second memory blocks) BLK1 and BLK2 (for example, first to eighth word lines WL1 to WL8 of the first memory block BLK1 and first to eighth word lines WL1 to WL8 of the second memory block BLK2) may be grouped into a plurality of word line groups.

The first to eighth word lines WL1 to WL8 of the first memory block BLK1 and the first to eighth word lines WL1 to WL8 of the second memory block BLK2 may have different strengths STR, and the clustering module (e.g., the clustering module CLM of FIG. 17A) of the memory controller (e.g., the memory controller 110b of FIG. 17A) may perform clustering on the basis of the strengths STR to group the first to eighth word lines WL1 to WL8 of the first memory block BLK1 and the first to eighth word lines WL1 to WL8 of the second memory block BLK2 into a plurality of word line groups (for example, the first group G1, the second group G2, and the third group G3).

For example, the clustering module CLM may set a clustering criterion on the basis of a strength STR distribution of the first to eighth word lines WL1 to WL8 of each of the first memory block BLK1 and the second memory block BLK2. For example, the clustering module CLM may group a plurality of word lines, having strength STR equal to or less than 0 and higher than −2, into the first group G1, group a plurality of word lines, having strength STR equal to or less than −2 and higher than −3, into the second group G2, and group a plurality of word lines, having strength STR equal to or less than −3, into the third group G3.

Therefore, the fifth word line WL5 of the first memory block BLK1 and the fourth to sixth word lines WL4 to WL6 of the second memory block BLK2 may be grouped into the first group G1, and the third word line WL3 and the fourth word line WL4 of the first memory block BLK1 and the second word line WL2, the third word line WL3, and the seventh word line WL7 of the second memory block BLK2 may be grouped into the second group G2. Also, the first word line WL1, the second word line WL2, the seventh word line WL7, and the eighth word line WL8 of the first memory block BLK1 and the first word line WL1 and the eighth word line WL8 of the second memory block BLK2 may be grouped into the third group G3.

Adjustment of a state count may be performed based on strength representing each word line in the first to third word line groups G1 to G3 of FIGS. 18A and 18B. For example, an average strength of each word line group may be calculated as strength representing a corresponding word line group, and adjustment of a state count may be performed based on the average strength. As another example, a lowest strength of each word line group may be calculated as strength representing a corresponding word line group, and adjustment of a state count may be performed based on the lowest strength. However, embodiments are not limited thereto, and adjustment of a state count on a plurality of word line groups may be performed based on various manners.

FIG. 18A illustrates an embodiment where adjustment of a state count is performed by units of one memory block, and FIG. 18B illustrates an embodiment where adjustment of a state count is performed by units of memory blocks. However, embodiments are not limited thereto, and adjustment of a state count may be performed by units of chips or by units of wafers. For example, in a case where adjustment of a state count is performed by units of wafers, a state count may be set for each word line or each word line group in a process of manufacturing a storage device, and the set state count may be stored in a non-volatile storage (for example, ROM) of a memory controller (110 of FIG. 1) or a non-volatile memory device (120 of FIG. 1), and for example, may be used at a runtime of the storage device 100.

Figure 19:
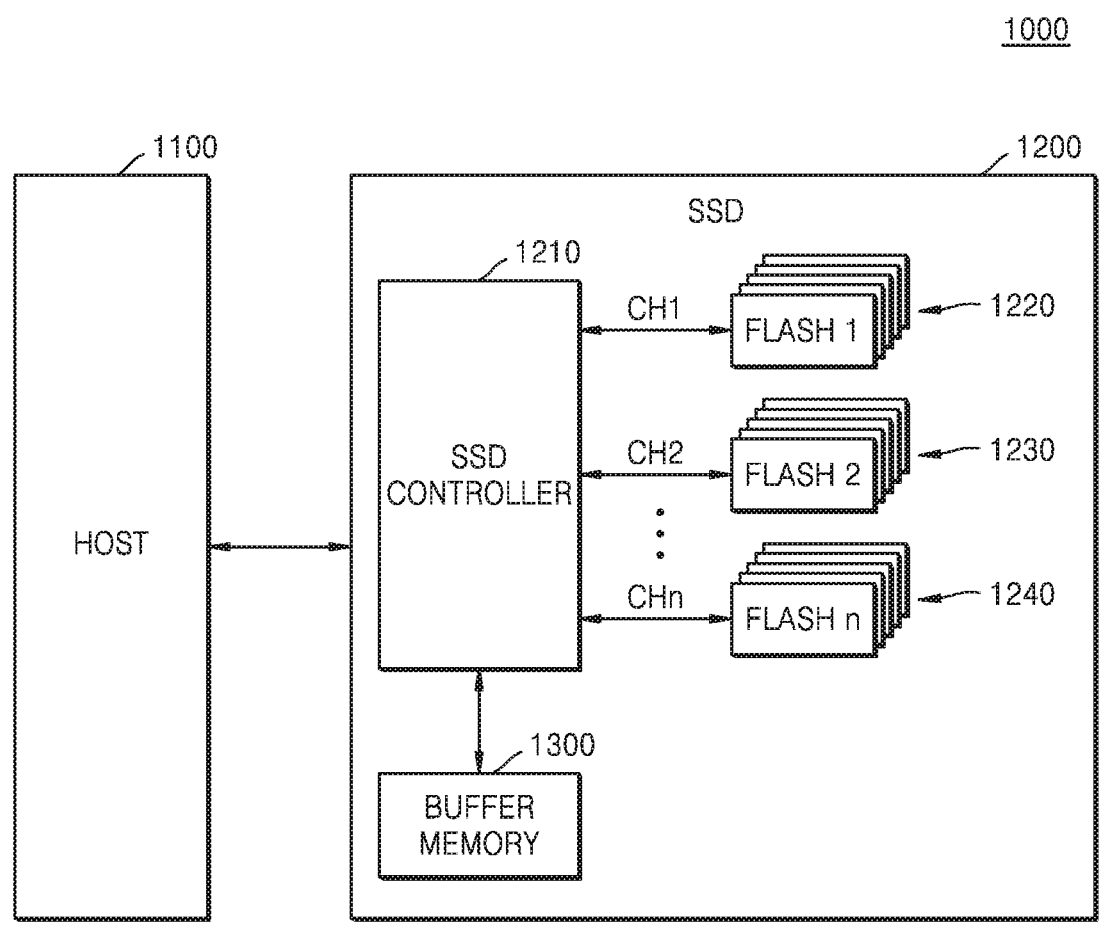
FIG. 19 is a block diagram representing a solid static driver (SSD) system according to an embodiment.

FIG. 19 is a block diagram representing a solid static drive (SSD) system 1000 according to an embodiment.

Referring to FIG. 19, the SSD system 1000 may include a host 1100 and an SSD 1200. The SSD 1200 may communicate with the host 1100 and may transmit and receive a signal (for example, a command, an address, and data) from and to the host 1100. The SSD 1200 may receive power from the host 2100 to operate.

The SSD 1200 may include an SSD controller 1210, a plurality of non-volatile memory devices 1220, 1230, and 1240, and a buffer memory 1300. The plurality of non-volatile memory devices 1220, 1230, and 1240 may be implemented as a plurality of semiconductor chips. The SSD controller 1210 may communicate with the non-volatile memory devices 1220, 1230, and 1240 through a plurality of channels CH1, CH2, and CHn. The buffer memory 1300 may be implemented as a volatile memory or a resistive memory, and for example, may be DRAM. The buffer memory 1300 may temporarily store data which is received from the host 1100 and is to be stored in the non-volatile memory devices 1220, 1230, and 1240, or may temporarily store data which is read from the non-volatile memory devices 1220, 1230, and 1240 and is to be transmitted to the host 1100.

The storage device 100 and the memory controller 110 each described above with reference to FIGS. 1 to 18B may be respectively applied to the SSD 1200 and the SSD controller 1210. The SSD controller 1210 may adjust a state count of each of a plurality of word lines or a plurality of word line groups by units of one memory block, by units of memory blocks, or by units of one semiconductor chip in the non-volatile memory devices 1220, 1230, and 1240, and may adjust a program parameter of each of the plurality of word lines or the plurality of word line groups. Therefore, the data reliability and lifetime of the SSD 1200 may be enhanced.

The storage system according to an embodiment may be equipped in or applied to a memory card system, a universal flash storage (UFS), and an embedded storage as well as the SSD system 1000.

According to some embodiments, operations described as being performed by the memory controller 110 may be performed by at least one processor for executing program code including instructions corresponding to the operations. The instructions may be stored in a memory. The term "processor" herein may denote, for example, a hardware-implemented data processing device including a circuit physically structuralized for performing certain operations including operations expressed as codes and/or instructions included in a program. In at least some embodiments, the hardware-implemented data processing device may include a microprocessor, a central processing unit (CPU), a processor core, a multi-processor core, a multiprocessor, an application-specific integrated circuit (ASIC), and an field programmable gate array (FPGA), but is not limited thereto.

While the inventive concept has been particularly shown and described with reference to various embodiments thereof, it will be understood that various changes in form and details may be made therein without departing from the spirit and scope of the following claims.

What is claimed is:

1. A storage device comprising:
a non-volatile memory including a plurality of memory blocks each including a plurality of word lines; and
a memory controller configured to determine a word line strength of each of the plurality of word lines, adjust a state count of each of the plurality of word lines based on the word line strengths, and adjust a program parameter of each of the plurality of word lines to decrease a program time variation between the plurality of word lines.

2. The storage device of claim 1, wherein the memory controller is configured to adjust the state count of each of the plurality of word lines so that a state count allocated to a first word line, which has a first word line strength, is more than a state count allocated to a second word line, which has a second word line strength that is lower than the first word line strength.

3. The storage device of claim 1, wherein the memory controller is configured to calculate the word line strength based on a real program time when a program operation is performed and an expected program time.

4. The storage device of claim 1, wherein the memory controller is configured to adjust the state count of each of the plurality of word lines when a difference between real program times of at least two word lines among the plurality of word lines is equal to or more than a reference time.

5. The storage device of claim 1, wherein the memory controller is configured to adjust the state count of each of the plurality of word lines to $2^S$ (where S is a natural number) based on integer-bit data.

6. The storage device of claim 1, wherein the memory controller is configured to adjust the state count by units of N (where N is an integer of 2 or more) word lines among the plurality of word lines and to adjust a state count of each of the N word lines to a state count based on fractional-bit data.

7. The storage device of claim 6, wherein the memory controller is configured to adjust the state count so that $2^S$ (where S is a natural number) states are set for each two memory cells included in one of the N word lines.

8. The storage device of claim 6, wherein the memory controller is configured to adjust the state count so that $2^S$ (where S is a natural number) states are set for each of N memory cells respectively corresponding to the N word lines.

9. The storage device of claim 1, wherein the memory controller is configured to dynamically group the plurality of word lines into a plurality of word line groups based on the word line strength and to collectively adjust the state count of word lines included in each of the plurality of word line groups by word line group.

10. The storage device of claim 1, wherein the memory controller is configured to obtain the program parameter and a state metric of each of the plurality of word lines and to adjust the state metric through reinforcement learning based on the program parameter and the state metric.

11. The storage device of claim 10, wherein the memory controller is configured to perform the reinforcement learning based on pre-stored profiling information.

12. The storage device of claim 10, wherein the memory controller is configured to store a plurality of state counts and a plurality of program parameters corresponding to each of the plurality of word lines and to perform a program operation on the non-volatile memory based on the state metric and the program parameter adjusted for each of the plurality of word lines at a runtime of the storage device.

13. The storage device of claim 1, wherein the memory controller is configured to dynamically adjust the state count and the program parameter of each of the plurality of word lines at a runtime of the storage device.

14. The storage device of claim 1, wherein the non-volatile memory comprises an array in which a plurality of non-volatile memory cells are vertically stacked on a substrate.

15. An operating method of a storage device including a non-volatile memory, the operating method comprising:
calculating a word line strength of each of a plurality of word lines of the non-volatile memory;
adjusting a state count of each of the plurality of word lines based on the word line strengths; and
adjusting a program parameter of each of the plurality of word lines to decrease a program time variation between the plurality of word lines.

16. The operating method of claim 15, wherein the calculating of the word line strength comprises:
calculating an expected program time of a word line based on a pre-set program parameter and a pre-set state count; and
calculating the word line strength based on a real program time of the word line that is measured, and the expected program time of the word line.

17. The operating method of claim 15, wherein the adjusting of the state count is performed when a maximum value of the program time variation between the plurality of word lines is equal to or greater than a threshold time.

18. The operating method of claim 15, wherein the adjusting of the state count comprises determining a first state count and a second state count for two word lines of the plurality of word lines so that multiplication of the first state count and the second state count for each of the two word lines is equal to or more than a value based on multiplication of a first previous state count and a second previous state count pre-set for each of the two word lines.

19. The operating method of claim 15, wherein the calculating of the word line strength and the adjusting of the state count are performed through reinforcement learning.

20. An operating method of a storage device including a non-volatile memory, the operating method comprising:
calculating a word line strength of each of a plurality of word lines included in the non-volatile memory;
grouping the plurality of word lines into a plurality of word line groups based on the word line strengths;
adjusting, by word line group, a state count of word lines of each of the plurality of word line groups based on the word line strengths of the word lines; and
adjusting, by word line group, a program parameter of the word lines of each of the plurality of word line groups to decrease a program time variation between the word lines of plurality of word line groups.

* * * * *